(12) United States Patent
Yamamoto et al.

(10) Patent No.: US 10,491,156 B2
(45) Date of Patent: Nov. 26, 2019

(54) CIRCUIT DEVICE, OSCILLATOR, ELECTRONIC APPARATUS, AND VEHICLE

(71) Applicant: Seiko Epson Corporation, Tokyo (JP)

(72) Inventors: Takehiro Yamamoto, Matsumoto (JP); Masayuki Ishikawa, Suwa (JP)

(73) Assignee: Seiko Epson Corporation (JP)

( * ) Notice: Subject to any disclaimer, the term of this patent is extended or adjusted under 35 U.S.C. 154(b) by 26 days.

(21) Appl. No.: 15/814,763

(22) Filed: Nov. 16, 2017

(65) Prior Publication Data

US 2018/0145629 A1 May 24, 2018

(30) Foreign Application Priority Data

Nov. 18, 2016 (JP) ................. 2016-224882

(51) Int. Cl.
*H03B 5/04* (2006.01)
*H03B 5/36* (2006.01)
(Continued)

(52) U.S. Cl.
CPC ................ *H03B 5/04* (2013.01); *H03B 5/20* (2013.01); *H03B 5/362* (2013.01); *H03L 1/028* (2013.01);
(Continued)

(58) Field of Classification Search
CPC ... H03B 5/04; H03B 5/30; H03B 5/32; H03B 5/36; H03B 5/362; H03B 5/364; H03B 5/368; H03L 1/02; H03L 1/022; H03L 1/023; H03L 1/025; H03L 1/026; H03L 1/028
(Continued)

(56) References Cited

U.S. PATENT DOCUMENTS 9,484,857 B2 11/2016 Itasaka et al.
9,484,926 B2 11/2016 Yamamoto
(Continued)

FOREIGN PATENT DOCUMENTS

JP 2006-054269 A 2/2006
JP 2015-090973 A 5/2015
(Continued)

*Primary Examiner* — Levi Gannon
(74) *Attorney, Agent, or Firm* — Harness, Dickey & Pierce, P.L.C.

(57) ABSTRACT

A circuit device includes an oscillation circuit configured to cause a resonator to oscillate, a clock signal output circuit configured to output a clock signal based on an oscillation signal from the oscillation circuit, a temperature compensation circuit configured to perform temperature compensation on an oscillation frequency of the oscillation signal, a low-potential-side power supply pad to which low-potential-side electric power is supplied, a high-potential-side power supply pad to which high-potential-side electric power is supplied, and an inter-power-supply capacitor provided between a low-potential-side power supply line electrically continuous with the low-potential-side power supply pad and a high-potential-side power supply line electrically continuous with the high-potential-side power supply pad. The inter-power-supply capacitor is formed of at least two metal layers provided in a region where the temperature compensation circuit is disposed in a plan view.

12 Claims, 14 Drawing Sheets

(51) Int. Cl.
*H03L 1/02* (2006.01)
*H03B 5/20* (2006.01)

(52) U.S. Cl.
CPC ............... *H03B 2200/004* (2013.01); *H03B 2200/0034* (2013.01); *H03B 2200/0038* (2013.01); *H03B 2200/0046* (2013.01)

(58) Field of Classification Search
USPC ................................................ 331/154, 158
See application file for complete search history.

(56) References Cited

U.S. PATENT DOCUMENTS

| | | | |
|---|---|---|---|
| 9,634,672 B2 | 4/2017 | Yamamoto | |
| 2002/0063608 A1* | 5/2002 | Sutliff | H03B 5/04 331/108 D |
| 2003/0132741 A1* | 7/2003 | Senthilkumar | H03K 3/012 324/100 |
| 2003/0210101 A1* | 11/2003 | McCorquodale | H01F 17/0006 331/117 FE |
| 2006/0164178 A1* | 7/2006 | Matsuura | H03B 5/366 331/158 |
| 2007/0222528 A1* | 9/2007 | Pernia | H03L 1/022 331/44 |
| 2010/0026403 A1* | 2/2010 | Rana | H03B 5/366 331/116 R |
| 2016/0241190 A1* | 8/2016 | Itasaka | H03B 5/364 |

FOREIGN PATENT DOCUMENTS

| | | |
|---|---|---|
| JP | 2016-134888 A | 7/2016 |
| JP | 2016-134889 A | 7/2016 |

\* cited by examiner

CIRCUIT DEVICE, OSCILLATOR, ELECTRONIC APPARATUS, AND VEHICLE

BACKGROUND

1. Technical Field

The present invention relates to a circuit device, an oscillator, an electronic apparatus, a vehicle, and the like.

2. Related Art

An oscillator, such as a TCXO (Temperature Compensated crystal Oscillator) and an OCXO (Oven Controlled crystal Oscillator), performs temperature compensation in which the temperature characteristic of the oscillation frequency is compensated. Since the temperature characteristic of the oscillation frequency is specific to an individual resonator, a parameter for compensation of the temperature characteristic is measured, for example, at the time of inspection of the oscillator and stored, for example, in a nonvolatile memory. When the oscillator is implemented and operated in a product, the temperature compensation is performed by using the parameter stored, for example, in the nonvolatile memory.

An oscillator of this type includes a resonator and an IC, and the IC includes an oscillation circuit, a temperature compensation circuit, and other components. JP-A-2006-54269, for example, discloses an example of an approach to the layout of the IC of the oscillator. In JP-A-2006-54269, an AC block (for example, analog circuit block that operates based on alternating current, such as an oscillation circuit) and a DC block (for example, analog circuit block that operates based on direct current, such as a temperature compensation circuit) are so arranged as to be separate from each other to prevent malfunction of a piezoelectric oscillator due to interference between the AC block and the DC block.

As described above, the parameter used to perform the temperature compensation is measured, for example, at the time of inspection of the oscillator, and after the oscillator is implemented in a product (on a circuit substrate, for example), the temperature compensation based on the parameter is performed. A difference between the environment in which the measurement and inspection are performed and the environment in which the oscillator is implemented in the product is likely to cause an error between the parameter obtained in the environment in which the measurement and inspection are performed and a parameter appropriate for the environment in which the oscillator is implemented in the product. The accuracy of temperature compensation in the environment in which the oscillator is implemented in the product is therefore likely to decrease.

SUMMARY

An advantage of some aspects of the invention is to provide a circuit device, an oscillator, an electronic apparatus, a vehicle, and the like capable of reducing an error in measurement of a parameter used in temperature compensation to improve the accuracy of the temperature compensation.

The invention can be implemented as the following forms or aspects.

An aspect of the invention relates to a circuit device including an oscillation circuit that causes a resonator to oscillate, a clock signal output circuit that outputs a clock signal based on an oscillation signal from the oscillation circuit, a temperature compensation circuit that performs temperature compensation on an oscillation frequency of the oscillation signal, a low-potential-side power supply pad to which low-potential-side electric power is supplied, a high-potential-side power supply pad to which high-potential-side electric power is supplied, and an inter-power-supply capacitor provided between a low-potential-side power supply line electrically continuous with the low-potential-side power supply pad and a high-potential-side power supply line electrically continuous with the high-potential-side power supply pad, and the inter-power-supply capacitor is formed of at least two metal layers provided in a region where the temperature compensation circuit is disposed in a plan view.

According to the aspect of the invention, the inter-power-supply capacitor is formed of at least two metal layers provided in the region where the temperature compensation circuit is disposed. That is, the inter-power-supply capacitor is formed in the circuit device. The impedance of the power supply lines is therefore unlikely to be affected by the environment outside the circuit device, whereby decrease in accuracy of the temperature compensation resulting from a difference between the measurement/inspection environment and the implementation environment can be reduced. As a result, an error in measurement of a parameter used in the temperature compensation can be reduced for improvement in the accuracy of the temperature compensation.

In the aspect of the invention, the inter-power-supply capacitor may be formed of an i-th metal layer and at least one metal layer located in a layer different from the i-th metal layer.

Forming the inter-power-supply capacitor by using the i-th metal layer and a metal layer located in a layer different from the i-th metal layer as described above allows the inter-power-supply capacitor to be provided by using metal layers in a region that does not interfere with wiring lines in the temperature compensation circuit. As a result, as compared with the layout area of a circuit device in a case where the temperature compensation circuit and the inter-power-supply capacitor are arranged completely side by side, a large-capacitance (necessary capacitance) inter-power-supply capacitor can be provided with no increase in the layout area.

In the aspect of the invention, the inter-power-supply capacitor may include a first capacitor formed of the i-th metal layer and an (i−1)-th metal layer and a second capacitor formed of the i-th metal layer and an (i+1)-th metal layer. One of the high-potential-side electric power and the low-potential-side electric power may be supplied to the i-th metal layer, and another of the high-potential-side electric power and the low-potential-side electric power may be supplied to the (i−1)-th and (i+1)-th metal layers.

Although the inter-power-supply capacitor needs to have large capacitance, it is difficult in some cases for an electrode having a two-layer structure for forming the inter-power-supply capacitor to achieve the required capacitance in a semiconductor chip because the area of the semiconductor chip is limited. In this regard, in the aspect of the invention, the i-th metal layer and the (i−1)-th and (i+1)-th metal layers above and below the i-th metal layer can be used to form the first and second capacitors in the same region. As a result, the capacitance of the inter-power-supply capacitor can be increased, whereby the accuracy of the temperature compensation can be further improved.

In the aspect of the invention, the circuit device may further include an adjustment capacitor for adjusting the oscillation frequency, and the adjustment capacitor may be formed of at least two metal layers provided in a region where the oscillation circuit is disposed in the plan view.

The oscillation circuit is provided with the adjustment capacitor formed of at least two metal layers, as described above. It is therefore difficult in some cases to provide an inter-power-supply capacitor having necessary large capacitance in the region where the oscillation circuit is disposed. Further, the oscillation signal produced by the oscillation circuit may be coupled to the inter-power-supply capacitor, undesirably resulting in power source noise in some cases. In this regard, according to the aspect of the invention, providing the inter-power-supply capacitor in the region where the temperature compensation circuit is disposed allows a necessary capacitance value (area) to be ensured. Further, it can be expected that the amount of coupling-induced power supply noise from the temperature compensation circuit is smaller than the amount of power supply noise from the oscillation circuit.

In the aspect of the invention, the circuit device may further include a first resonator connection pad connected to one end of the resonator, a second resonator connection pad connected to another end of the resonator, a control voltage input pad to which control voltage that controls the oscillation frequency generated by the oscillation circuit is inputted, a clock signal output pad via which the clock signal is outputted, and a second inter-power-supply capacitor. The low-potential-side power supply pad, the first resonator connection pad, and the control voltage input pad may be disposed in a first pad disposition region along a first edge of the circuit device. The clock signal output pad, the second resonator connection pad, and the high-potential-side power supply pad may be disposed in a second pad disposition region along a second edge of the circuit device that faces away from the first edge. The second inter-power-supply capacitor may be disposed in at least one of the first pad disposition region and the second pad disposition region.

Providing the second inter-power-supply capacitor in any of the pad disposition regions as described above allows effective use of a vacant portion of the pad disposition region for increase in the capacitance of the inter-power-supply capacitor and hence improvement in the function as a bypass capacitor. The accuracy of the temperature compensation is therefore likely to be further improved. Further, as will be described later, removing the pad disposition regions but leaving a circuit disposition region allows creation of a shrunk-version layout having a decreased layout area, as will be described later. In this case, the second inter-power-supply capacitor is omitted, but the inter-power-supply capacitor provided in the region where the temperature compensation circuit is disposed reduces decrease in the accuracy of the temperature compensation also in the shrunk-version layout.

In the aspect of the invention, the oscillation circuit, the clock signal output circuit, and the temperature compensation circuit may be disposed in a circuit disposition region between the first pad disposition region and the second pad disposition region in the plan view.

Disposing the oscillation circuit, the clock signal output circuit, and the temperature compensation circuit in the circuit disposition region between the first pad disposition region and the second pad disposition region as described above allows a non-shrunk-version layout and a shrunk-version layout to be changed from one to the other by a simple procedure. That is, the circuit disposition region can be extracted by removing the first pad disposition region and the second pad disposition region for creation of a shrunk-version layout.

In the aspect of the invention, the circuit device may further include a first electrostatic protection circuit connected to the low-potential-side power supply pad and a second electrostatic protection circuit connected to the high-potential-side power supply pad. The low-potential-side power supply pad may be disposed in the first pad disposition region along the first edge of the circuit device. The high-potential-side power supply pad may be disposed in the second pad disposition region along the second edge of the circuit device that faces away from the first edge. The first electrostatic protection circuit and the second electrostatic protection circuit may be disposed in the circuit disposition region between the first pad disposition region and the second pad disposition region.

As a result, in a case where bonding to a pad requires high reliability, for example, in an in-vehicle application, a non-shrunk-version layout (layout in which no electrostatic protection circuit is disposed below a pad) can be employed. On the other hand, in a case where the bonding reliability is not necessarily required, a shrunk-version layout formed of an extracted circuit disposition region (layout in which an electrostatic protection circuit is disposed below a pad but the area is reduced) can be employed. The layouts in the two cases described above can thus be simply changed from one to the other.

In the aspect of the invention, the circuit device may further include a reference voltage generation circuit that includes a resistor circuit for adjusting reference voltage and supplies the temperature compensation circuit with the reference voltage. A resistive element that forms the resistor circuit may be made of polysilicon, and the polysilicon may be formed on a well to which low-potential-side power supply voltage is applied.

Since the reference voltage is supplied to the temperature compensation circuit, the quality of the reference voltage (amount of noise and accuracy of voltage, for example) affects the accuracy of the temperature compensation. In this regard, according to the aspect of the invention, since the resistive element (polysilicon) that forms the reference voltage generation circuit is formed on the well to which the low-potential-side power supply voltage is applied, the amount of noise contained in the reference voltage can be reduced. The decrease in the accuracy of the temperature compensation due to the difference in the power supply environment can therefore be further reduced.

Another aspect of the invention relates to an oscillator including any of the circuit devices described above and the resonator electrically continuous with the oscillation circuit.

Still another aspect of the invention relates to an electronic apparatus including any of the circuit devices described above.

Still another aspect of the invention relates to a vehicle including any of the circuit devices described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferable embodiment of the invention will be described below in detail. It is not intended that the present embodiment described below unduly limits the contents of the invention set forth in the appended claims, and all configurations described in the present embodiment are not necessarily essential as a solution provided by the invention.

1. Circuit Device

Figure 1:
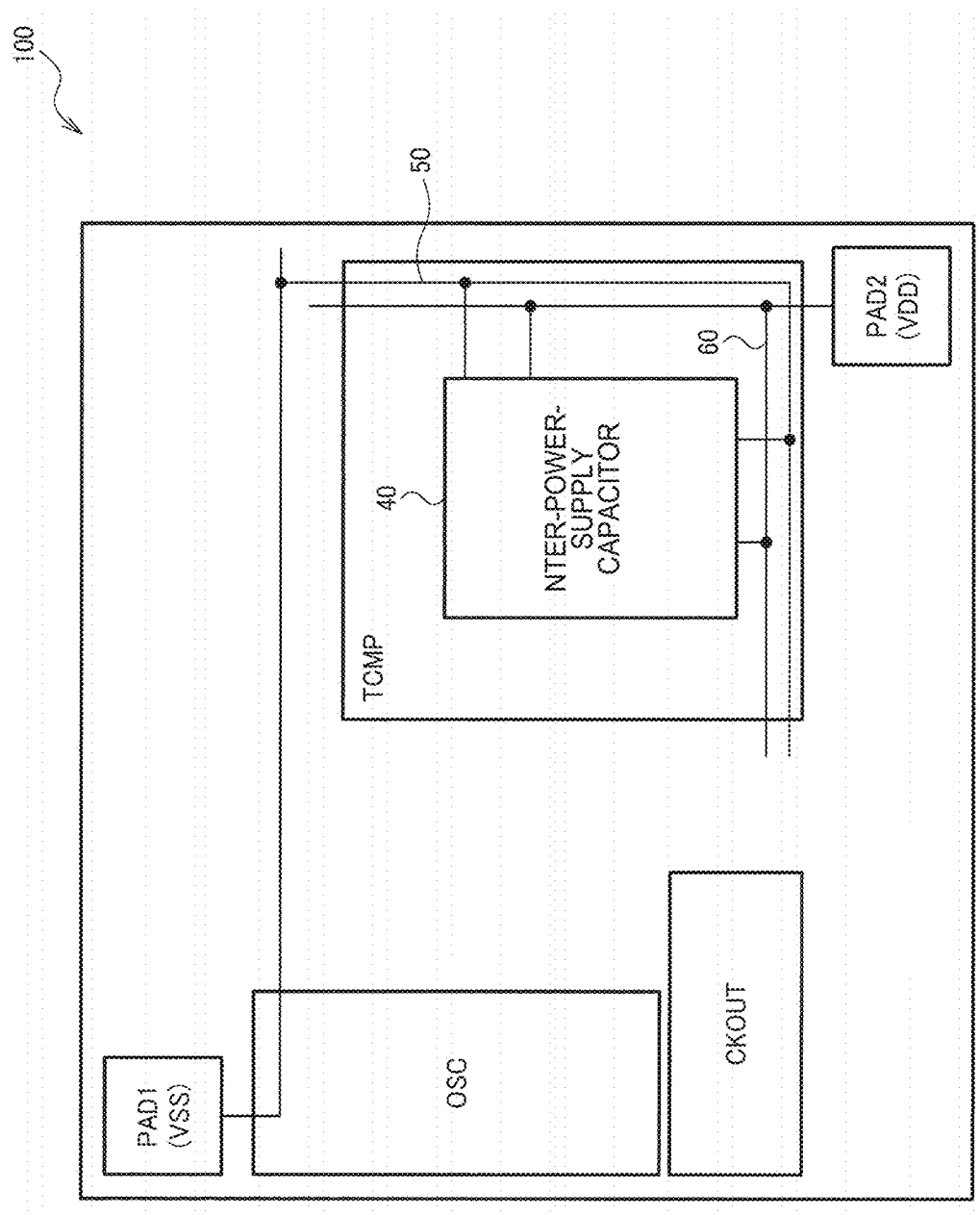
FIG. 1 is an example of the layout configuration of a circuit device according to an embodiment of the invention.

FIG. 1 shows an example of the layout configuration of a circuit device 100 according to the present embodiment. The circuit device 100 includes an oscillation circuit, a clock signal output circuit, a temperature compensation circuit, a low-potential-side power supply pad (first pad), a high-potential-side power supply pad (second pad), and an inter-power-supply capacitor 40. It is noted that the present embodiment is not limited to the configuration in FIG. 1, and that part of the components in the configuration can be omitted, another component can be added to the configuration, and a variety of other variations are conceivable. For example, the following description will be made with reference to a case where one inter-power-supply capacitor is disposed in a disposition region TCMP (in one region) of the temperature compensation circuit, but not necessarily. That is, a plurality of inter-power-supply capacitors may instead be disposed in the disposition region TCMP (in plurality of separate regions of disposition region TCMP) of the temperature compensation circuit.

The oscillation circuit (disposed in disposition region OSC) is a circuit that causes a resonator to oscillate. The clock signal output circuit (disposed indisposition region CKOUT) is a circuit that outputs a clock signal based on an oscillation signal from the oscillation circuit. The temperature compensation circuit (disposed in disposition region TCMP) is a circuit that performs temperature compensation on the oscillation frequency of the oscillation signal (oscillation circuit). The circuits will be described later in detail. The low-potential-side power supply pad (PAD1) is a pad to which electric power from low-potential-side power supply VSS (low-potential-side power supply potential) is supplied. The high-potential-side power supply pad (PAD2) is a pad to which electric power from high-potential-side power supply VDD (high-potential-side power supply potential) is supplied. The inter-power-supply capacitor 40 is provided between a low-potential-side power supply line 50, which is electrically continuous with the low-potential-side power supply pad (extracted from low-potential-side power supply pad), and a high-potential-side power supply line 60, which is electrically continuous with the high-potential-side power supply pad (extracted from high-potential-side power supply pad). The inter-power-supply capacitor 40 is a capacitor that is formed of at least two metal layers and disposed in the disposition region TCMP of the temperature compensation circuit.

Specifically, a pad is a terminal for electrically connecting a circuit in a semiconductor chip to a circuit (or terminal) outside the semiconductor chip. The low-potential-side power supply pad and the high-potential-side power supply pad are disposed in pad regions PAD1 and PAD2, respectively. Each of the pad regions is a region that is part of one of the metal layers (uppermost metal layer, for example) and exposed from a passivation film (insulating layer). The exposed metal layer forms the pad.

The low-potential-side power supply VSS (first power supply, such as ground) and the high-potential-side power supply VDD (second power supply) externally supply the circuit device 100 with electric power via the low-potential-side power supply pad and the high-potential-side power supply pad. The high-potential-side power supply VDD supplies electric power having potential higher than that of the electric power supplied from the low-potential-side power supply VSS.

The low-potential-side power supply line 50 and the high-potential-side power supply line 60 are wiring lines via which each portion of the circuit device 100 is supplied with the low-potential-side electric power and the high-potential-side electric power inputted via the low-potential-side power supply pad and the high-potential-side power supply pad. The power supply lines are formed of a wiring layer (metal layer) of the semiconductor chip.

The oscillation circuit, the clock signal output circuit, and the temperature compensation circuit are disposed in the disposition regions OSC, CKOUT, and TCMP, respectively. A circuit disposition region is a region where components of the circuit are disposed, that is, a region where circuit elements that form the circuit, wiring lines that connect the circuit elements to each other, a guard bar (a structure that connects a diffusion region provided around the circuit to a power supply or any other component to protect the circuit, for example, from noise), and other components are disposed. The circuit elements include, for example, a transistor, a resistor, and a capacitor, and a polysilicon layer, a diffusion layer, and a metal layer that forms the circuit elements are disposed in the disposition region.

The inter-power-supply capacitor 40 is an MIM (metal-insulator-metal) capacitor formed of (configured by) two metal layers or three or more metal layers. In the case where the inter-power-supply capacitor 40 is formed of two layers, one of the two layers forms one end of the capacitor, and the other layer forms the other end of the capacitor. In the case where the inter-power-supply capacitor 40 is formed of three or more layers, one of the layers forms one end of the capacitor, and the layers above and below the one layer correspond to the other end of the capacitor. One of the low-potential-side power supply line and the high-potential-side power supply line is connected to one end of the capacitor, and the other one of the low-potential-side power supply line and the high-potential-side power supply line is connected to the other end of the capacitor. In a case where a plurality of inter-power-supply capacitors are provided, the connection relationship of one end and the other end of each of the inter-power-supply capacitors with the high-potential-side power supply line and the low-potential-side power supply line may vary on an inter-power-supply capacitor basis.

Figure 4:
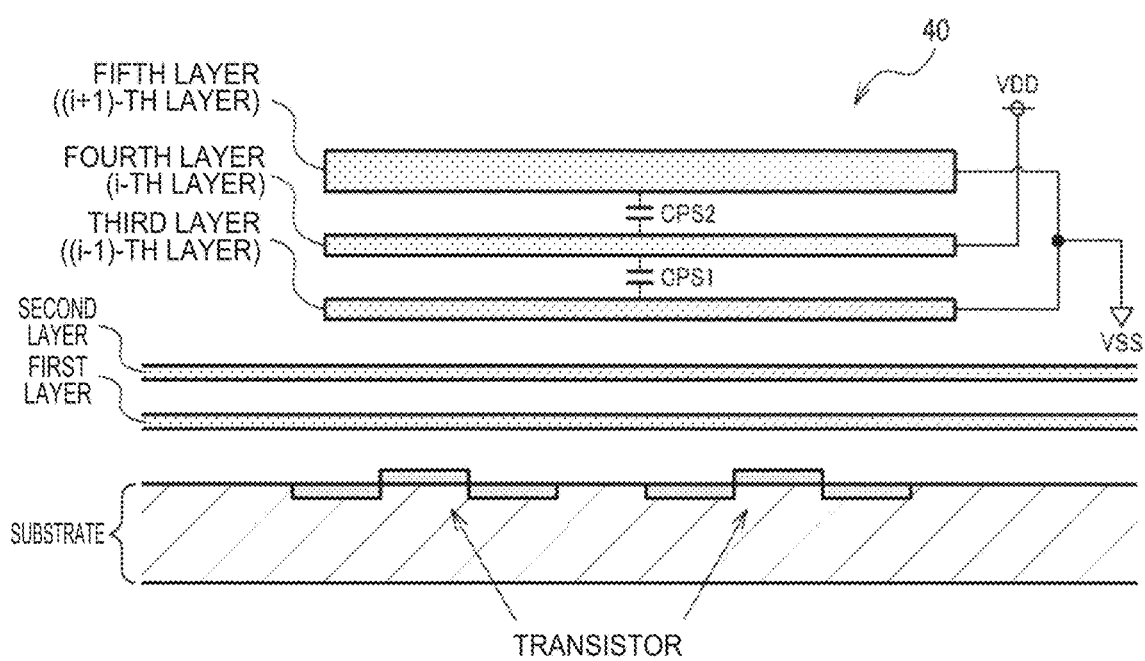
FIG. 4 shows an example of a detailed configuration of the inter-power-supply capacitor.

The metal layers that form the inter-power-supply capacitor 40 are provided on the temperature compensation circuit. That is, in a plan view of the circuit device 100 (semiconductor chip), the inter-power-supply capacitor 40 is so disposed that the circuit elements and wiring lines that form the temperature compensation circuit overlap with the inter-power-supply capacitor 40 (metal layers that form capacitor), as shown in FIG. 1. Further, as shown in FIG. 4 which will be described later in a cross-sectional view of the circuit device 100 (semiconductor chip), the inter-power-supply capacitor 40 (metal layers that form capacitor) is disposed in a layer above the circuit elements and wiring lines that form the temperature compensation circuit. Specifically, in the temperature compensation circuit disposition region TCMP, the inter-power-supply capacitor 40 is formed by using a metal layer where the wiring lines that form the temperature compensation circuit are not provided. For example, in a case where there is a region where the wiring lines are provided only in lower layers of the plurality of metal layers (first and second layers of first to fifth layers, for example), the metal layers above the region (third to fifth layers, for example) form the inter-power-supply capacitor 40.

Providing the inter-power-supply capacitor 40 in the circuit device 100 as described above allows the impedance of the power supply lines to be unlikely to be affected by the environment outside the circuit device 100 (for example, resistance, inductance, and other factors of power supply lines outside pads of circuit device 100). Decrease in accuracy of the temperature compensation resulting from the difference between the measurement/inspection environment and the implementation environment or the difference in implementation state can therefore be reduced.

Further, providing the inter-power-supply capacitor 40 in the temperature compensation circuit disposition region TCMP, allows effective use of the circuit area in providing the inter-power-supply capacitor (bypass capacitor). That is, in a case where the oscillation circuit or any other circuit is provided with an MIM capacitor (capacitor for adjusting oscillation frequency, for example) and it is therefore difficult to add an inter-power-supply capacitor having large capacitance, the inter-power-supply capacitor can be provided above the temperature compensation circuit. In particular, in a case where the temperature compensation circuit uses no large-capacitance MIM capacitor, an inter-power-supply capacitor can be provided above the temperature compensation circuit with not so large increase in the layout area only for addition of the inter-power-supply capacitor.

The temperature compensation circuit performs DC-based (low-speed) operation as compared with AC-based (high-speed, high-frequency) operation of the oscillation circuit, the clock signal output circuit, a digital circuit (memory, for example). Therefore, even in a case where capacitance coupling is present between the wiring lines or any other component of the temperature compensation circuit and the inter-power-supply capacitor 40, power supply noise due to the capacitance coupling is unlikely to occur. The amount of power supply noise can thus be reduced as compared with a case where the inter-power-supply capacitor is provided in the disposition region OSC, where the oscillation circuit and other components are disposed.

The circuit device 100 is so implemented in a package that the pads of the circuit device 100 face internal terminals of the package, as will be described later with reference to FIGS. 8 and 15. In this process, in particular, if the package-side terminals are greater than the pads, part of the package-side terminals is likely to face the circuit disposition regions of the circuit device 100. When part of the terminal connected to a resonator device via internal wiring in the package faces the temperature compensation circuit disposition region TCMP, the capacitance coupling causes the oscillation signal to propagate to the temperature compensation circuit, probably affecting the accuracy of the temperature compensation. In this regard, in the present embodiment, in which the inter-power-supply capacitor 40 formed of metal layers is provided in the temperature compensation circuit disposition region TCMP, the inter-power-supply capacitor 40 can function as a shield against the capacitance coupling.

The reduction in the decrease in accuracy of the temperature compensation due to the environmental difference will be described below in detail with reference to FIGS. 2 and 3.

Figure 2:
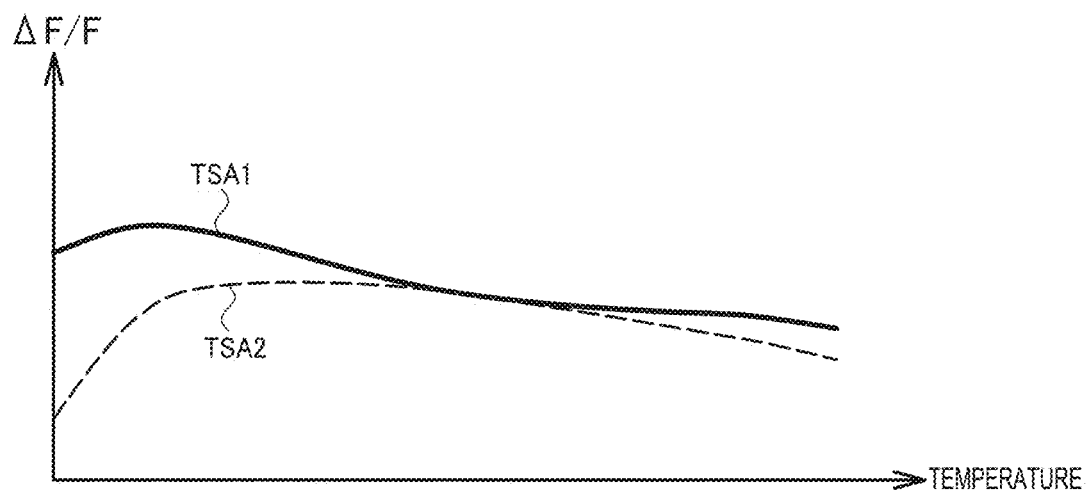
FIG. 2 shows temperature characteristics of deviation in the oscillation frequency of an oscillator using a circuit device with no inter-power-supply capacitor.

FIG. 2 shows temperature characteristics (frequency-temperature characteristics) of deviation $\Delta F/F$ in the oscillation frequency of an oscillator using a circuit device with no inter-power-supply capacitor. The oscillation frequency deviation $\Delta F/F$ is the quotient of the difference $\Delta F$ between a reference oscillation frequency F (nominal oscillation frequency, for example) and the oscillation frequency divided by the reference oscillation frequency F.

TSA1 represents the temperature characteristic measured in the inspection environment, and TSA2 represents the temperature characteristic measured in the implementation environment. The inspection environment is a state in which the oscillator is inserted into a socket mounted on a circuit substrate. The inspection environment to which the invention is applicable is not limited to the environment described above, and a state in which a probe pin is caused to be in contact with a terminal of the oscillator may, for example, be the inspection environment. The implementation environment is a state in which the terminal of the oscillator is connected (connected with solder, for example) to a wiring pattern (or terminal) on the circuit substrate.

In the case where the socket is used, an in-socket wiring line connects the terminal of the oscillator (power supply terminal or ground terminal, for example) to the wiring pattern on the circuit substrate. Since the inter-power-supply bypass capacitor is provided on the circuit substrate, the wiring line from the terminal of the oscillator to the bypass capacitor has a long length. Since the wiring lines have parasitic inductance and parasitic resistance, and contact resistance is present between the terminal of the oscillator and the terminal of the socket, the impedance of the portion from the terminal of the oscillator to the bypass capacitor undesirably has a large value. Although the power supply noise that occurs in the circuit device 100 is reduced by the bypass capacitor, the wiring line impedance described above undesirably causes the noise reduction effect to decrease.

The decrease in the noise reduction effect also occurs when a probe pin is used to perform the measurement. That is, the probe pin is provided on the circuit substrate of a tester, and the inter-power-supply bypass capacitor is also provided on the circuit substrate. The parasitic inductance and parasitic resistance of the probe pin and the contact resistance between the terminal of the oscillator and the probe pin therefore undesirably increase the impedance of the portion from the terminal of the oscillator to the bypass capacitor.

On the other hand, in a case where the oscillator is mounted on the circuit substrate, the bypass capacitor can be provided in a position close to the terminal of the oscillator (with a wiring length shorter than that in the case where a probe pin is used). The impedance viewed from the pads of the circuit device 100 is the sum of the impedance of the portion from the pads to the terminal on the package of the oscillator and the impedance of the short wiring line described above. That is, the impedance is smaller than the impedance viewed from the pads of the circuit device 100 in the environment in which a socket or any other component is used.

The environmental differences described above cause the temperature characteristic TSA1 of the oscillation frequency deviation in the inspection environment to differ from the temperature characteristic TSA2 of the oscillation frequency deviation in the implementation environment. A temperature compensation parameter is so determined on the basis of the temperature characteristic TSA1 of the oscillation frequency measured in the inspection environment that the temperature characteristic falls within a specification range having a center of $\Delta F/F=0$. That is, performing the temperature compensation by using the temperature compensation parameter allows the temperature characteristic in the inspection environment to fall within the specification range having the center of $\Delta F/F=0$. However, since the temperature characteristic in the inspection environment differs from that in the implementation environment, the accuracy of the temperature compensation undesirably decreases by the difference in the implementation environment.

Figure 3:
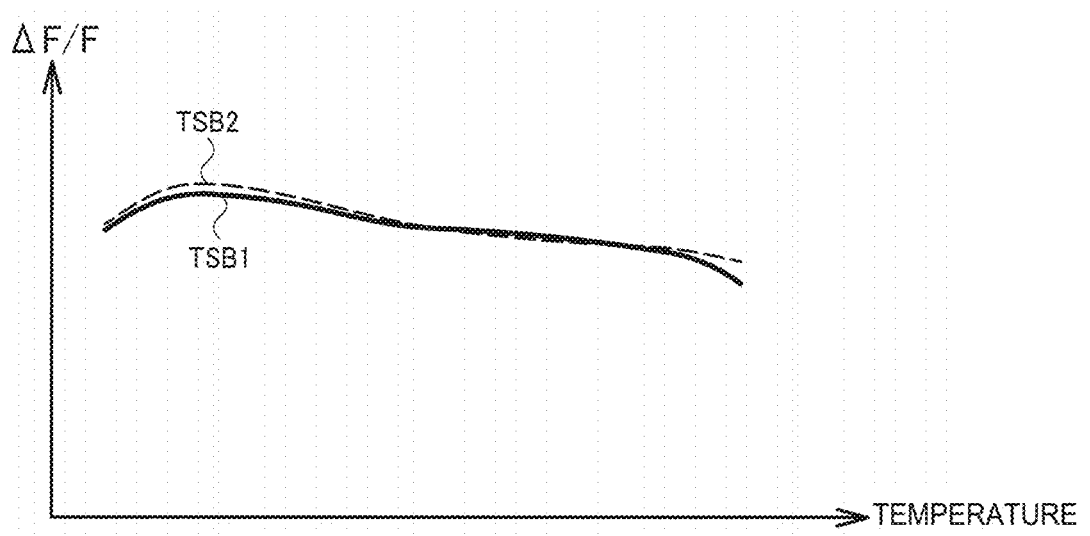
FIG. 3 shows temperature characteristics of deviation in the oscillation frequency of an oscillator using the circuit device according to the present embodiment.

FIG. 3 shows temperature characteristics of the deviation $\Delta F/F$ in the oscillation frequency of an oscillator using the circuit device 100 according to the present embodiment. TSB1 represents the temperature characteristic measured in the inspection environment, and TSB2 represents the temperature characteristic measured in the implementation environment.

In the present embodiment, the inter-power-supply capacitor 40 is provided in the circuit device 100. The impedance of the portion from a power supply noise source to the inter-power-supply capacitor 40 is roughly fixed without being affected by the environment outside the circuit device 100 (impedance of power supply line outside pads). That is, even when the inspection environment and the implementation environment differ from each other, the power supply noise produced in the circuit device 100 travels through wiring lines having roughly the same impedance in the two environments and reaches the inter-power-supply capacitor 40, which reduces the noise.

The use of the circuit device 100 according to the present embodiment allows reduction in the difference between the temperature characteristic TSB1 of the oscillation frequency deviation in the inspection environment and the temperature characteristic TSB2 of the oscillation frequency deviation in the implementation environment, as shown in FIG. 3. The temperature compensation parameter determined on the basis of the temperature characteristic TSB1 of the oscillation frequency measured in the inspection environment therefore allows accurate temperature compensation to be achieved in the implementation environment.

2. Inter-Power-Supply Capacitor

FIG. 4 shows an example of a detailed configuration of the inter-power-supply capacitor 40. FIG. 4 is a cross-sectional view diagrammatically showing the semiconductor chip (circuit device 100).

The inter-power-supply capacitor 40 is a capacitor formed of an i-th metal layer and at least one metal layer located in a layer different from the i-th metal layer, as shown in FIG. 4. The i-th metal layer is one of the plurality of metal layers formed in the semiconductor chip. That is, assuming that the metal layers laminated on a substrate of the semiconductor chip are called a first metal layer, a second metal layer, . . . , and an n-th metal layer (n is an integer greater than or equal to 2) counted from below to above (sequentially counted from the layer close to the substrate), any of the metal layers is the i-th metal layer (i is an integer greater than or equal to 1 but smaller than or equal to n). FIG. 4 shows a case where n=5 and i=4, but n and i are not limited thereto. In FIG. 4, the upward direction coincides with the thickness direction of the substrate (direction perpendicular to surfaces of substrate) and represents the direction in which insulating layers and metal layers are laminated in semiconductor processes.

Forming the inter-power-supply capacitor 40 by using the i-th metal layer and a metal layer located in a layer different from the i-th metal layer as described above allows the inter-power-supply capacitor 40 to be disposed in the temperature compensation circuit disposition region TCMP. That is, the inter-power-supply capacitor 40 can be provided by using metal layers in a region that does not interfere with the wiring lines in the temperature compensation circuit.

More specifically, for example, the inter-power-supply capacitor 40 includes a first capacitor CPS1, which is formed of the i-th metal layer and the (i−1)-th metal layer, and a second capacitor CPS2, which is formed of the i-th metal layer and the (i+1)-th metal layer. Electric power from one of the high-potential-side power supply VDD and the low-potential-side power supply VSS is supplied to the i-th metal layer, and electric power from the other one of the high-potential-side power supply VDD and the low-potential-side power supply VSS is supplied to the (i−1)-th and (i+1)-th metal layers. For example, it is desirable that electric power from the high-potential-side power supply VDD is supplied to the i-th metal layer, and that electric power from the low-potential-side power supply VSS is supplied to the (i−1)-th and (i+1)-th metal layers, as shown in FIG. 4. The effect of shielding the oscillation signal is therefore likely to be enhanced. The above configuration is not necessarily employed; electric power from the low-potential-side power supply VSS may be supplied to the i-th metal layer, and electric power from the high-potential-side power supply VDD may be supplied to the (i−1)-th and (i+1)-th metal layers. In this case, the following condition needs to be satisfied: 1<i<n.

For example, the (i−1)-th, i-th, and (i+1)-th metal layers that form the inter-power-supply capacitor 40 are the third, fourth, and fifth metal layers, as shown in FIG. 4. The first and second metal layers are used, for example, to form the wiring lines in the temperature compensation circuit. A circuit element that forms the temperature compensation circuit, such as a transistor, may be disposed on a substrate below the inter-power-supply capacitor 40.

Although the inter-power-supply capacitor 40 needs to have large capacitance, it is difficult to achieve the required capacitance in the semiconductor chip. In this regard, the i-th metal layer and the (i−1)-th and (i+1)-th metal layers above and below the i-th metal layer can be used to form two capacitors (first capacitor CPS1 and second capacitor CSP2) in the same region, as in the example of the present embodiment. As a result, the capacitance of the inter-power-supply capacitor 40 can be increased, whereby the accuracy of the temperature compensation can be further improved.

3. Example of Detailed Layout Configuration of Circuit Device

Figure 5:
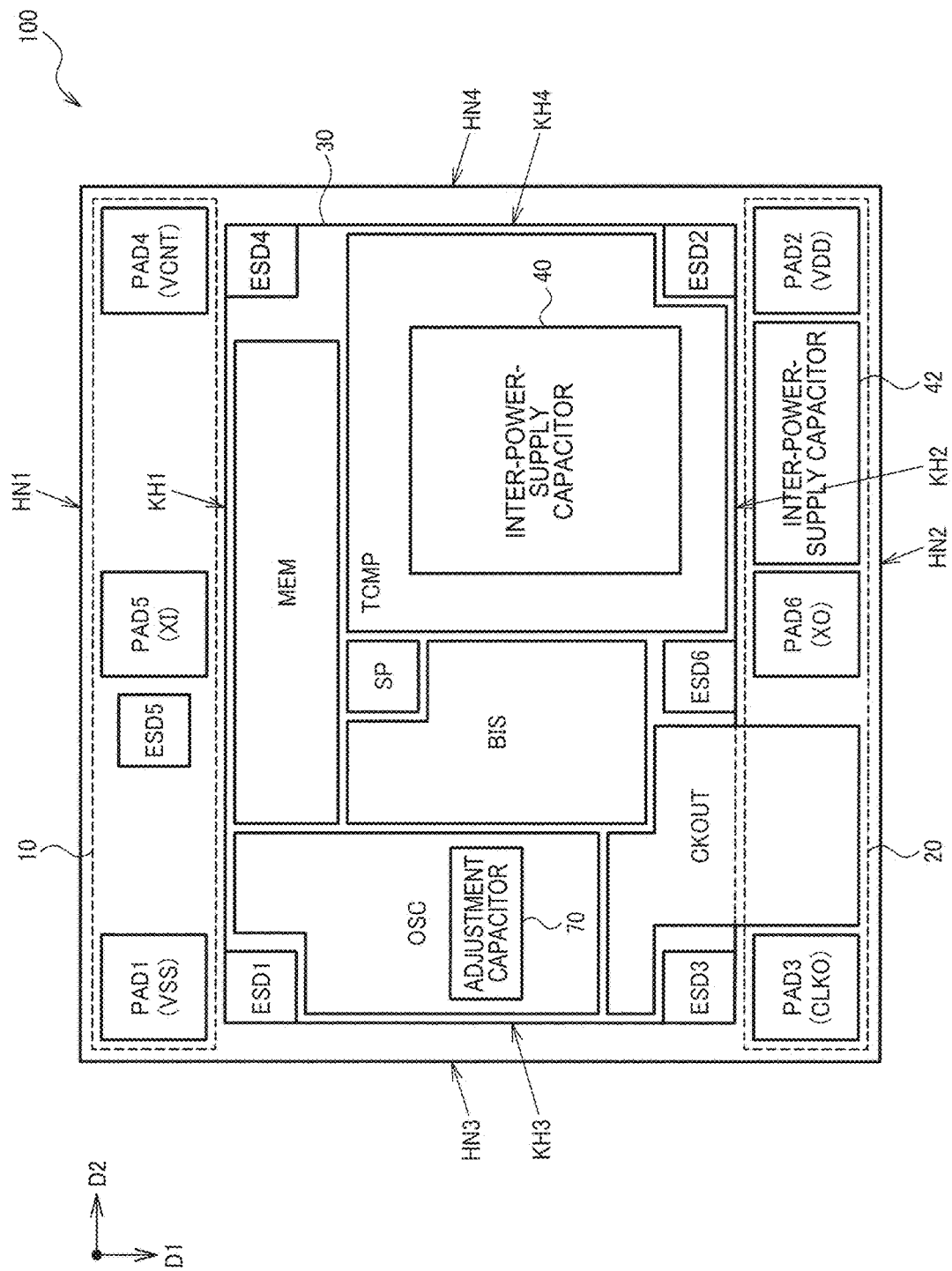
FIG. 5 shows an example of a detailed layout configuration of the circuit device according to the present embodiment.

FIG. 5 shows an example of a detailed plan-view layout configuration of the circuit device 100 according to the present embodiment. It is noted that the present embodiment is not limited to the configuration in FIG. 5, and that part of the components in the configuration can be omitted, another component can be added to the configuration, and a variety of other variations are conceivable.

The circuit device 100 includes an adjustment capacitor 70 for adjusting the oscillation frequency of the oscillation signal, as shown in FIG. 5. The adjustment capacitor 70 is a capacitor formed of at least two metal layers provided in the oscillation circuit disposition region OSC in a plan view. Specifically, the adjustment capacitor 70 is formed of the same metal layers that form the inter-power-supply capacitor 40. That is, the adjustment capacitor 70 is formed of at least two of the (i−1)-th, i-th, and (i+1)-th metal layers described with reference to FIG. 4.

The oscillation circuit is provided with the adjustment capacitor 70 formed of the same metal layers that form the inter-power-supply capacitor 40, as described above. It is therefore difficult to provide an inter-power-supply capacitor having necessary large capacitance in the oscillation circuit disposition region OSC. Further, a coupling phenomenon may undesirably cause the oscillation signal produced by the oscillation circuit to propagate to the inter-power-supply capacitor, undesirably resulting in power source noise in some cases. In this regard, according to the present embodiment, providing the inter-power-supply capacitor 40 in the temperature compensation circuit disposition region TCMP allows a necessary capacitance value (area) to be ensured. Further, it can be expected that the amount of coupling-induced power supply noise from the temperature compensation circuit is smaller than the amount of power supply noise from the oscillation circuit.

Further, in the present embodiment, the circuit device 100 includes a first resonator connection pad (PAD5) connected to one end of the resonator, a second resonator connection pad (PAD6) connected to the other end of the resonator, a control voltage input pad (PAD4) to which control voltage that controls the oscillation frequency of the oscillation signal from the oscillation circuit is inputted (PAD3), a clock signal output pad (PAD3) via which the clock signal is outputted, and a second inter-power-supply capacitor 42. The low-potential-side power supply pad (PAD1), the first resonator connection pad (PAD5), and the control voltage input pad (PAD4) are disposed in a first pad disposition region 10 along a first edge HN1 of the circuit device 100. The clock signal output pad (PAD3), the second resonator connection pad (PAD6), and the high-potential-side power supply pad (PAD2) are disposed in a second pad disposition region 20 along a second edge HN2 of the circuit device 100, which faces away from the first edge HN1. The second inter-power-supply capacitor 42 is disposed in at least one of the first pad disposition region 10 and the second pad disposition region 20.

Specifically, the clock signal output pad, the control voltage input pad, the first resonator connection pad, and the second resonator connection pad are disposed in the pad regions PAD3, PAD4, PAD5, and PAD6, respectively.

A pad disposition region is a region where pads are disposed. In the pad disposition region, the pads do not need to be adjacent to each other, and the pads may be separated from each other via a gap. The region that contains (surrounds) the plurality of pads is the pad disposition region. The first pad disposition region 10 is an oblong region having long edges extending in the direction along the first edge HN1 and short edges extending in the direction along a third edge HN3 (or fourth edge HN4). For example, the first pad disposition region 10 is a minimum oblong region out of possible oblong regions containing the pad regions PAD1, PAD5, and PAD4. No pad or circuit element is disposed between the first pad disposition region 10 and the first edge HN1. The second pad disposition region 20 is an oblong region having long edges extending in the direction along the second edge HN2 and short edges extending in the direction along the third edge HN3 (or fourth edge HN4). For example, the second pad disposition region 20 is a minimum oblong region out of possible oblong regions containing the pad regions PAD3, PAD6, and PAD2. No pad or circuit element is disposed between the second pad disposition region 20 and the second edge HN2.

The first to fourth edges HN1 to HN4 of the circuit device 100 are edges of the semiconductor chip (silicon substrate). The third edge HN3 and the fourth edge HN4 are edges that intersect (at right angles, for example) the first edge HN1 and the second edge HN2. The fourth edge HN4 is an edge that faces away from the third edge HN3, and in a case where the circuit device 100 has, for example, an oblong or square shape, the fourth edge HN4 is an edge parallel (including roughly parallel) to the third edge HN3.

The second inter-power-supply capacitor 42 is disposed in at least one of the first pad disposition region 10 and the second pad disposition region 20 and in a region where no pad is disposed (region containing no PAD1 to PAD6). That is, in a plan view of the circuit device 100 (semiconductor chip), the second inter-power-supply capacitor 42 is so disposed that the pad disposition region contains the second inter-power-supply capacitor 42 (metal layers that form capacitor) but the pad regions PAD1 to PAD6 do not overlap with the second inter-power-supply capacitor. Further, in a cross-sectional view of the circuit device 100 (semiconductor chip), a wiring line and an element of some kind may or may not be disposed in the layer below the second inter-power-supply capacitor 42 (metal layers that form capacitor). FIG. 5 shows a case where an inter-power-supply capacitor is provided in the second pad disposition region 20, but not necessarily, and an inter-power-supply capacitor may be provided in the first pad disposition region 10, or inter-power-supply capacitors may be provided in both the first and second pad disposition regions 10, 20.

Providing the second inter-power-supply capacitor 42 in any of the pad disposition regions as described above allows effective use of a vacant portion of the pad disposition region (portion where no pad is provided) for increase in the capacitance of the inter-power-supply capacitor and hence improvement in the function as the bypass capacitor. The accuracy of the temperature compensation is therefore likely to be further improved. Further, as will be described later, removing the pad disposition regions but leaving a circuit disposition region 30 allows creation of a shrunk-version layout having a decreased layout area, as will be described later. In this case, the second inter-power-supply capacitor 42 is omitted, but the inter-power-supply capacitor 40 provided in the temperature compensation circuit disposition region TCMP reduces decrease in the accuracy of the temperature compensation also in the shrunk-version layout.

Further, in the present embodiment, the oscillation circuit, the clock signal output circuit, and the temperature compensation circuit are disposed in the circuit disposition region 30, which is located between the first pad disposition region 10 and the second pad disposition region 20 in a plan view. The circuit device 100 can further include a nonvolatile memory that stores information on the temperature compensation parameter for compensation of the oscillation frequency and a reference voltage generation circuit (bias circuit) that supplies each portion of the circuit device 100 with electric power and reference voltage.

Specifically, the circuit disposition region 30 is a region where a core circuit of the circuit device 100 is disposed. The core circuit is a circuit for achieving the function of the circuit device 100. For example, the core circuit is a circuit that processes signals inputted to and outputted from the circuit device 100, a circuit that produces a signal to be outputted from the circuit device, and other circuits. For example, in a case where the circuit device 100 is a circuit device that controls a TCXO (temperature compensated crystal oscillator) or any other similar oscillator, the oscillation circuit, the clock signal output circuit, the temperature compensation circuit, the bias circuit, the memory, and other components corresponding to the core circuit. For example, in the semiconductor chip, the entire region except the first pad disposition region 10 and the second pad disposition region 20 is the circuit disposition region 30. Instead, a minimum oblong or square out of possible oblongs and squares containing the core circuit of the circuit device 100 is the circuit disposition region 30.

The oscillation circuit, the clock signal output circuit, the temperature compensation circuit, the nonvolatile memory, and the reference voltage generation circuit are disposed in disposition regions OSC, CKOUT, TCMP, MEM, and BIS, respectively in the disposition region 30. The disposition region OSC is a region that is in contact with edges KH1 and KH3 of the circuit disposition region 30 and has a roughly oblong (or roughly square) shape. The disposition region CKOUT is a region that is disposed in a position shifted from the disposition region OSC in a first direction D1 and is adjacent to the disposition region OSC. The first direction D1 is the direction from the side facing the first edge NH1 of the circuit device 100 toward the side facing the second edge NH2 thereof. The disposition region TCMP is a region that is in contact with edges KH2 and KH4 of the circuit disposition region 30, has a roughly oblong (or roughly square) shape, and is disposed in a position shifted from the disposition regions OSC and CKOUT in a second direction D2. The second direction D2 is not only a direction that intersects (at right angles) the first direction D1 but is a direction from the side facing the third edge NH3 of the circuit device 100 toward the side facing the fourth edge NH4 thereof. The disposition region MEM is a region that is in contact with the edge KH1 of the circuit disposition region 30, has an oblong (roughly oblong) shape having long edges along the edge KH1, and is adjacent to the disposition regions OSC and TCMP. The disposition region BIS is a region that is disposed between the disposition regions OSC and TCMP, is surrounded by the disposition regions OSC, CKOUT, TCMP, and MEM, and has a roughly oblong (or roughly square) shape.

The circuits described above (the regions where the circuits are disposed) may instead be partially disposed in the first pad disposition region 10 or the second pad disposition region 20. In the example shown in FIG. 5, part of the clock signal output circuit (CKOUT) is disposed in the second pad disposition region 20. To create a shrunk-version circuit device, the portion disposed in a region outside the circuit disposition region 30 may be so disposed as to fall within the circuit disposition region 30 or may be removed.

Disposing the core circuit of the circuit device 100 in the circuit disposition region 30 between the first pad disposition region 10 and the second pad disposition region 20 as described above allows the non-shrunk-version layout shown in FIG. 5 and the shrunk-version layout, which will be described later, to be changed from one to the other by a simple procedure. That is, the circuit disposition region 30, where the core circuit can be disposed, can be extracted by removing the first pad disposition region 10 and the second pad disposition region 20 for creation of a shrunk-version layout.

More specifically, the circuit device 100 includes a first electrostatic protection circuit connected to the low-potential-side power supply pad (PAD1) and a second electrostatic protection circuit connected to the high-potential-side power supply pad (PAD2). The first and second electrostatic protection circuits are disposed in the circuit disposition region 30. The circuit device 100 can further include a third electrostatic protection circuit connected to the clock signal output pad (PAD3), a fourth electrostatic protection circuit connected to the control voltage input pad (PAD4), a fifth electrostatic protection circuit connected to the first resonator connection pad (PAD5), and a sixth electrostatic protection circuit connected to the second resonator connection pad (PAD6). The third, fourth, and sixth electrostatic protection circuits are disposed in the circuit disposition region 30. The fifth electrostatic protection circuit is disposed in the first pad disposition region 10.

Specifically, the first to sixth electrostatic protection circuits are disposed in first to sixth disposition regions ESD1 to ESD6, respectively. The first to sixth disposition regions ESD1 to ESD6 are each a region where an electrostatic protection circuit is disposed and which has a size that allows a pad to be disposed. For example, the first to sixth disposition regions ESD1 to ESD6 are each a minimum square (or oblong) region where a pad having a size determined on the basis of a design rule can be disposed. An electrostatic protection circuit is a circuit that protects elements and circuits in the circuit device 100 from excess voltage or current applied to a pad (terminal of IC). For example, an electrostatic protection circuit can be formed, for example, of a diode or a transistor connected between a pad and a power supply (diode-connected transistor, for example).

As a result, in a case where bonding to a pad requires high reliability, for example, in an in-vehicle application, a non-shrunk-version layout, such as that shown in FIG. 5, can be employed, or in some cases, pads disposed in the disposition regions ESD1 to ESD6, which will be described later, can be used for implementation, test, or other purposes. On the other hand, in a case where the bonding reliability is not necessarily required, a shrunk-version layout formed of the extracted circuit disposition region 30 (with first pad disposition region 10 and second pad disposition region 20 removed) can be employed. The layouts in the two cases described above can thus be simply changed from one to the other. A more specific description will be made below with reference to FIG. 6.

Figure 6:
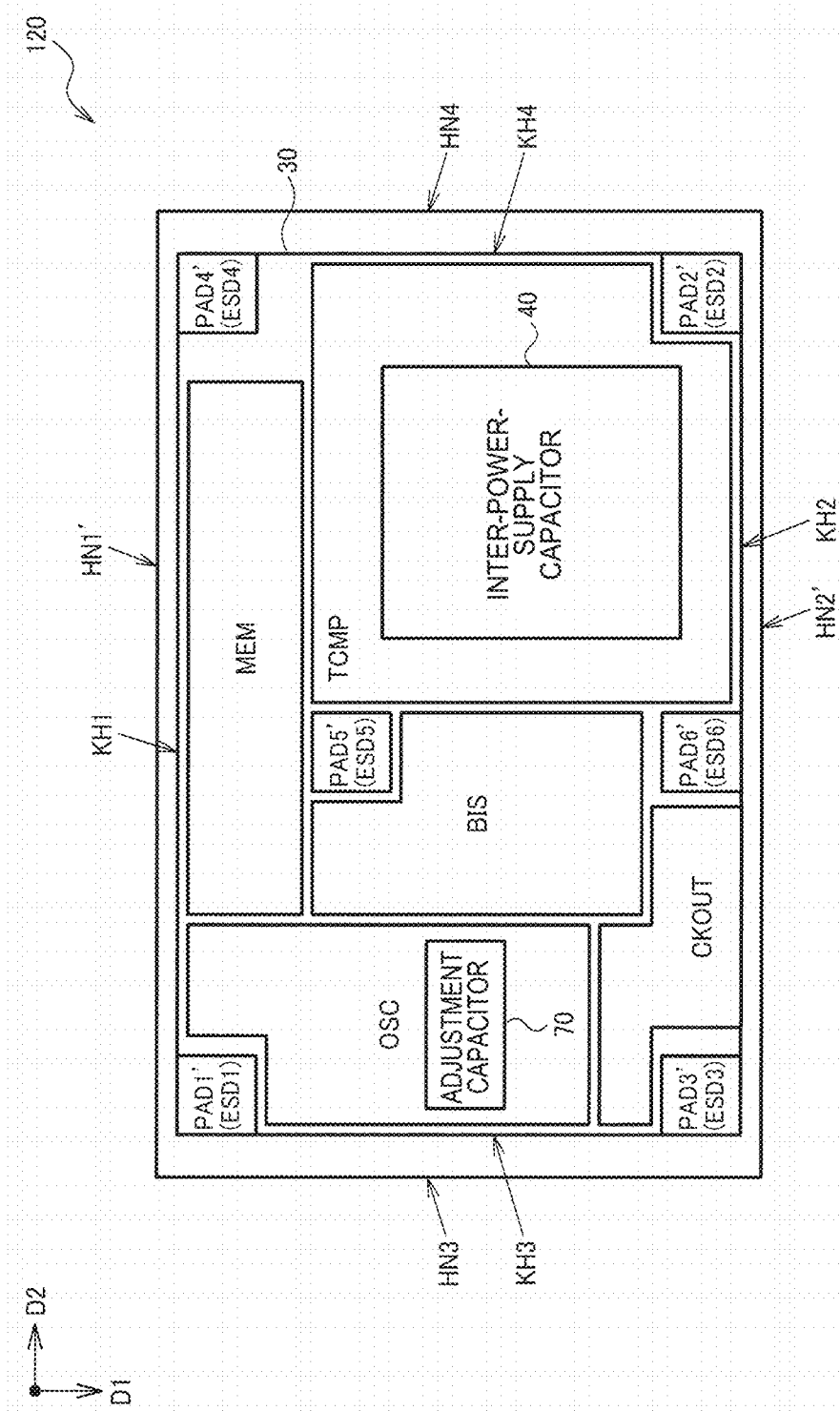
FIG. 6 is an example of the layout configuration of a shrunk-version circuit device.

FIG. 6 is an example of the layout configuration of a shrunk-version circuit device 120. In FIG. 6, a pad is disposed in each of pad regions PAD1' to PAD6'. The pad regions PAD1' to PAD4' and PAD6' correspond to the disposition regions ESD1 to ESD4 and ESD6 in FIG. 5. That is, an electrostatic protection circuit is provided below a pad and the pad is connected to the electrostatic protection circuit provided below the pad. The pad region PAD5' corresponds to a disposition region SP in FIG. 5. The disposition region SP is a region having a size that allows a pad to be disposed. That is, in the shrunk-version layout, a pad connected to one end of the resonator and the fifth electrostatic protection circuit connected to the pad are disposed in the disposition region SP. The disposition region SP is disposed in a position shifted from the disposition region MEM, where the nonvolatile memory is disposed, in the first direction D1. More specifically, the disposition region SP is a region surrounded by the disposition region MEM, where the nonvolatile memory is disposed, the disposition region BIS, where the voltage generation circuit is disposed, and the disposition region TCMP, where the temperature compensation circuit is disposed.

In FIG. 6, no first pad disposition region 10 is provided between a first edge HN1' of the circuit device 120 and the edge KH1 of the circuit disposition region 30. The edge KH1 is an edge adjacent to the first pad disposition region 10 in FIG. 5. For example, the first edge HN1' corresponds to a straight line between the edge KH1 of the circuit disposition region 30 and the first pad disposition region 10 in FIG. 5 or the edge KH1 itself of the circuit disposition region 30. Similarly, no second pad disposition region 20 is provided between a second edge HN2' of the circuit device 120 and the edge KH2 of the circuit disposition region 30. The edge KH2 is an edge adjacent to the second pad disposition region 20 in FIG. 5. For example, the second edge HN2' corresponds to a straight line between the edge KH2 of the circuit disposition region 30 and the second pad disposition region 20 in FIG. 5 or the edge KH2 itself of the circuit disposition region 30. The edges KH3 and KH4 of the circuit disposition region 30 are edges adjacent to the third edge HN3 and the fourth edge HN4 of the circuit device 100 (or edges that coincide with third edge HN3 and fourth edge HN4).

As described above, in the shrunk-version circuit device 120, the size of the semiconductor chip is reduced to the size corresponding to the circuit disposition region 30, and a pad is provided in an electrostatic protection circuit disposition region. In a case where bonding to a pad does not necessarily require reliability, employing a shrunk version, such as that described above, allows cost reduction. On the other hand, in a case where bonding to a pad requires high reliability, employing a non-shrunk version, such as that shown in FIG. 5, allows an electrostatic protection circuit to be provided in a region separate from the pad for improvement in reliability of the electrostatic protection. That is, influence of stress and other factors resulting from the bonding on the electrostatic protection circuit can be reduced. Further, a pad size and a pad structure different from those of a pad in a shrunk version can be employed. As a result, certainty of the contact in the bonding can be improved, or influence of the bonding on the circuit device 100 (cracking, for example) can be reduced.

In the present embodiment, as illustrated in FIG. 5, the first pad (PAD1) and the first electrostatic protection circuit (ESD1) are so disposed as to sandwich a first boundary between the first pad disposition region 10 and the circuit disposition region 30. The fourth pad (PAD4) and the fourth electrostatic protection circuit (ESD4) are so disposed as to sandwich the first boundary. The third pad (PAD3) and the third electrostatic protection circuit (ESD3) are so disposed as to sandwich a second boundary between the second pad disposition region 20 and the circuit disposition region 30. The second pad (PAD2) and the second electrostatic protection circuit (ESD2) are so disposed as to sandwich the second boundary.

As described above, when the pads and the electrostatic protection circuits are so disposed as to sandwich the boundaries between the pad disposition regions 10, 20 and the circuit disposition region 30, the pad disposition regions 10, 20 and the circuit disposition region can be separate from each other along the boundaries therebetween (or along portions close to boundaries). The layout of the shrunk-version circuit device 120 can therefore be created by removing the layout of the first pad disposition region 10 and the second pad disposition region 20 outside the boundaries (or outside portions close to boundaries).

Further, in the present embodiment, the first to fourth pads (PAD1 to PAD4) are disposed in corner regions of the circuit device 100 (corners where edges of circuit device 100 intersect each other), and the first to fourth electrostatic protection circuits (ESD1 to ESD4) are disposed in corner regions of the circuit disposition region 30 (corners where edges of circuit disposition region 30 intersect each other).

A pad and an electrostatic protection circuit connected to the pad are therefore so disposed as to close to (adjacent to or contiguous to) each other. For example, the corner which forms the circuit disposition region 30 and where the first electrostatic protection circuit (ESD1) is disposed is, out of the corners of the circuit disposition region 30, closest to a first corner which forms the circuit device 100 and where the first pad (PAD1) is disposed. In a case where a pad and an electrostatic protection circuit is connected to each other with a long wiring line, the resistance of the wiring line and other factors are likely to degrade the electrostatic protection function. According to the present embodiment, however, the degradation in the electrostatic protection function can be avoided.

Further, in the present embodiment, the area of the low-potential-side power supply pad (PAD1) is greater than the area of the first electrostatic protection circuit disposition region ESD1. The area of the high-potential-side power supply pad (PAD2) is greater than the area of the second electrostatic protection circuit disposition region ESD2. The area of the clock signal output pad (PAD3) is greater than the area of the third electrostatic protection circuit disposition region ESD3. The area of the control voltage input pad (PAD4) is greater than the area of the fourth electrostatic protection circuit disposition region ESD4. The area of the first resonator connection pad (PAD5) is greater than the area of the disposition region SP. The area of the second resonator connection pad (PAD6) is greater than the area of the sixth electrostatic protection circuit disposition region ESD6.

Figure 7:
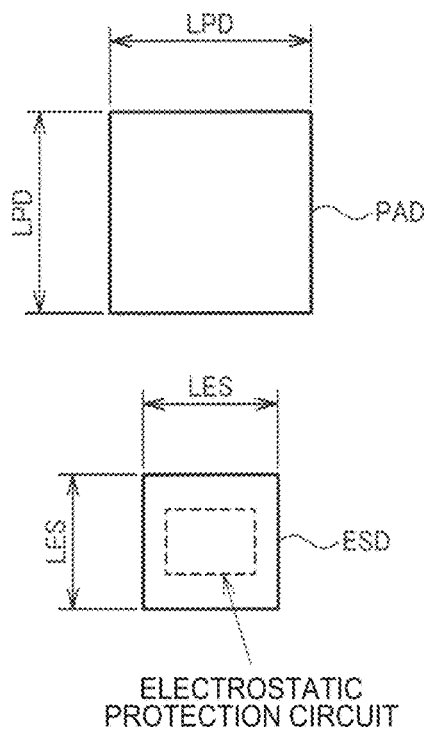
FIG. 7 shows an example of the sizes of a pad region and an electrostatic protection circuit disposition region in a case where the regions each have a square shape.

FIG. 7 shows an example of the sizes of a pad region and an electrostatic protection circuit disposition region in a case where the regions each have a square shape. Reference character PAD represents each of the pad regions PAD1 to PAD6. Reference character ESD represent each of the electrostatic protection circuit disposition regions ESD1 to ESD4, ESD6 and the disposition region SP. The length LPD of one edge of the pad region PAD where a pad is disposed in the non-shrunk-version circuit device 100 is greater than the length LES of one edge of the disposition region ESD where a pad is disposed in the shrunk-version circuit device 120, as shown in FIG. 7.

The non-shrunk-version circuit device 100 can thus use a pad having an area greater than the area of a pad in the shrunk-version circuit device 120. The bonding reliability in the non-shrunk-version circuit device 100 can therefore be improved. This point will be described with reference to FIG. 8.

Figure 8:
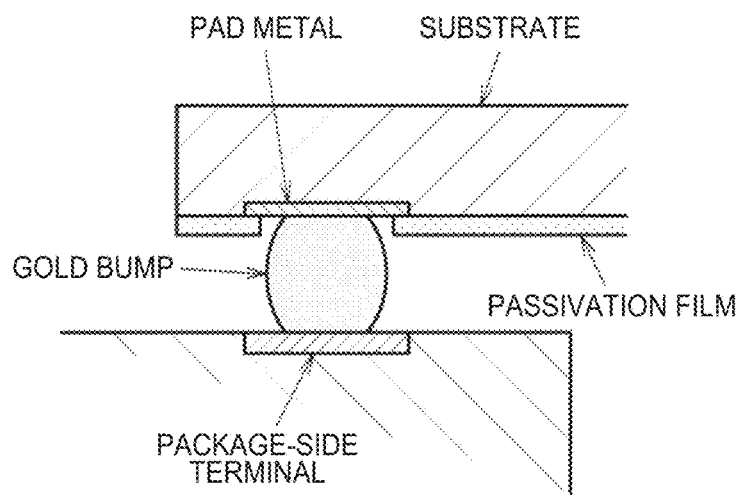
FIG. 8 shows an example illustrating how terminals are connected to each other when the circuit device is implemented in a package.

FIG. 8 shows an example illustrating how terminals are connected to each other when the circuit device (100, 120) is implemented in a package. FIG. 8 shows an example of what is called flip-chip implementation in which a semiconductor chip is implemented in the form of a bare chip (in a state in which semiconductor chip is not accommodated in a package and via no lead terminal or any other component).

A gold bump is sandwiched between a pad of the circuit device (pad metal exposed through passivation film) and a package-side terminal (terminal provided in package), as shown in FIG. 8. The gold bump is then so crushed that the pad is pressed against the package-side terminal, and the pad is connected to the package-side terminal via the gold bump. The gold bump is a bump (grain) made of gold (Au).

In the implementation performed as described above, the crushed gold bump is likely to damage the semiconductor chip. For example, the crushed bump is likely to cause the passivation film to crack. Further, in a case where a pad has a small area, the implementation is likely to result in connection failure (that is, connection with large contact resistance), or stress acting on the semiconductor chip and the package after the implementation is likely to cause posterior connection failure. In this regard, according to the present embodiment, in a case where bonding reliability is required, a non-shrunk-version layout, in which a pad has a large area, can be employed. As a result, the possibility of damage of the semiconductor chip and the possibility of the connection failure described above can be reduced. On the other hand, in a case where bonding reliability as high as in an in-vehicle application is not required, employing a shrunk-version layout allows cost reduction.

4. Reference Voltage Generation Circuit

Figure 9:
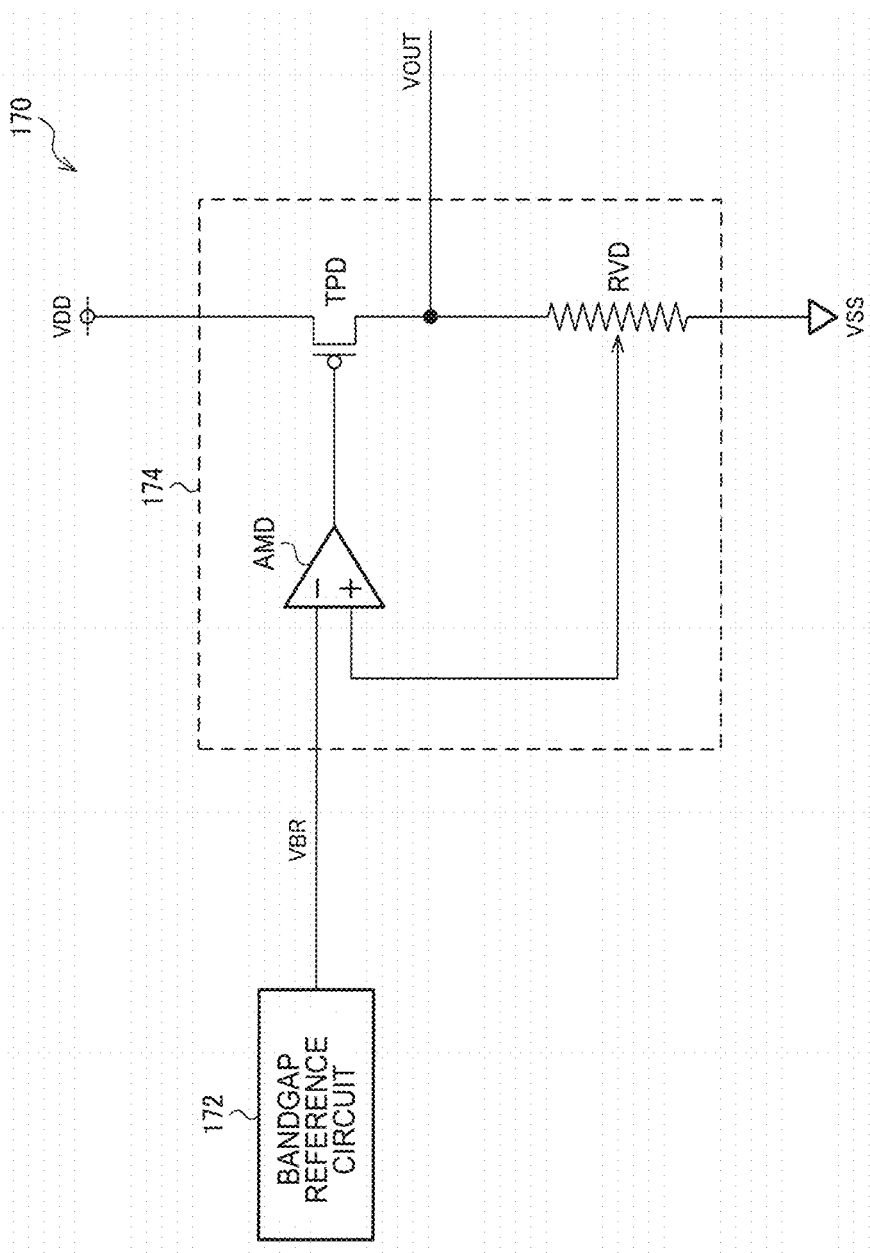
FIG. 9 shows an example of a detailed configuration of a reference voltage generation circuit.

FIG. 9 shows an example of a detailed configuration of a reference voltage generation circuit 170. The reference voltage generation circuit 170 includes a bandgap reference circuit 172 and a regulator 174. The regulator 174 includes an amplifier circuit AMD, a transistor TPD, and a resistor circuit RVD (variable resistor circuit). It is noted that the present embodiment is not limited to the configuration in FIG. 9, and that part of the components in the configuration can be omitted, another component can be added to the configuration, and a variety of other variations are conceivable. For example, a plurality of regulators may be provided.

The bandgap reference circuit 172 is a circuit that generates fixed reference voltage VBR independent of temperature on the basis of semiconductor bandgap voltage (bandgap energy). Since the bandgap voltage has temperature dependency, voltage having opposite temperature dependency is used to generate fixed voltage independent of temperature. The bandgap reference circuit is formed, for example, of bipolar transistors or MOS transistors, resistive elements, and other components.

The regulator 174 regulates (boosts) the reference voltage VBR and outputs the resultant reference voltage VOUT. The reference voltage VOUT is used, for example, as a reference voltage for the temperature compensation circuit (for example, reference voltage for function generation circuit, specifically, for example, reference voltage for first-order component generation circuit 230, third-order component generation circuit 240, and higher-order component generation circuit 250 in FIG. 14). FIG. 9 shows an example of the configuration of the regulator 174 in a case where the regulator 174 is a linear regulator.

The resistor circuit RVD includes a ladder resistor (plurality of resistive elements), which is located between the output node of the regulator 174 and the node of the low-potential-side power supply VSS and connected to each other in series, and a switch circuit. The switch circuit connects any of a plurality of taps (inter-resistive-element nodes) of the ladder resistor to a first input node (non-inverted input terminal) of the amplifier circuit AMD. The gain of the regulator 174 (voltage value of reference voltage VOUT) is determined in accordance with the tap selected by the switch circuit. The thus set gain value (tap selected by switch circuit) may have been stored, for example, in the nonvolatile memory in advance or may be set via a register.

The transistor TPD is, for example, a P-type MOS transistor (first conductivity type transistor) and is provided between the node of the high-potential-side power supply VDD and the output node of the regulator 174. The voltage outputted from the amplifier circuit AMD is supplied to the gate of the transistor TPD. The reference voltage VBR from the bandgap reference circuit 172 is inputted to a second input node (inverted input terminal) of the amplifier circuit AMD, and the regulator 174, which is a non-inversion amplification amplifier, regulates the reference voltage VBR into the reference voltage VOUT.

Figure 10:
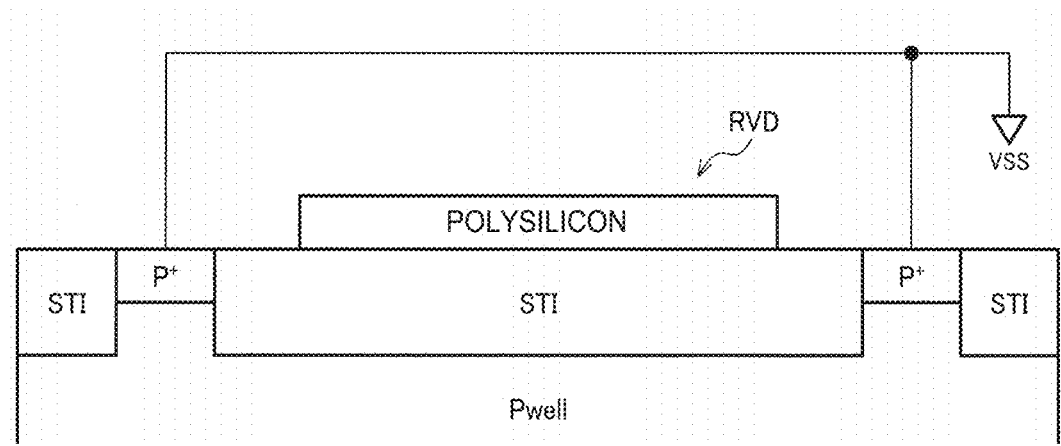
FIG. 10 is a diagrammatic cross-sectional view of a resistive element that forms a resistor circuit.

FIG. 10 is a diagrammatic cross-sectional view of a resistive element that forms the resistor circuit RVD. The resistive element is each of the plurality of resistive elements that form the ladder resistor.

In the present embodiment, the reference voltage generation circuit 170 includes the resistor circuit RVD for reference voltage adjustment and supplies the temperature compensation circuit with the reference voltage VOUT, as described above. The resistive elements that form the resistor circuit RVD are each made of polysilicon (polycrystalline silicon), as shown in FIG. 10. The polysilicon is formed on a well to which the low-potential-side power supply voltage (voltage produced by low-potential-side power supply VSS) is applied.

Specifically, a p-type well (Pwell) is formed in the substrate of the semiconductor chip, and a shallow trench isolation (STI) structure is formed in the p-type well. The shallow trench isolation structure is a structure in which a trench is formed in the substrate and an insulating film (silicon oxide film) is embedded in the trench. The polysilicon, which is a resistive element, is formed on the shallow trench isolation structure. The p-type well is so formed as to cover the shallow trench isolation structure on which the polysilicon is paced and connected to the low-potential-side power supply VSS via a p-type diffusion region (P+).

The resistive elements provided in the bandgap reference circuit 172 also have the same configuration shown in FIG. 10. It is, however, noted that all the plurality of resistive elements provided in the bandgap reference circuit 172 or the regulator 174 are not necessarily configured as shown in FIG. 10. For example, part of the resistive elements may be formed on a well to which the voltage produced by the high-potential-side power supply VDD is applied.

Since the reference voltage VOUT is supplied to the temperature compensation circuit, the quality of the reference voltage VOUT (amount of noise and accuracy of voltage, for example) affects the accuracy of the temperature compensation. In this regard, according to the present embodiment, since the resistive elements (polysilicon) that form the reference voltage generation circuit 170 are each formed on the well to which the low-potential-side power supply voltage is applied, the amount of noise contained in the reference voltage VOUT can be reduced. The decrease in the accuracy of the temperature compensation due to the difference in the power supply environment can therefore be further reduced.

5. Example of Detailed Configuration of Circuit Device

Figure 11:
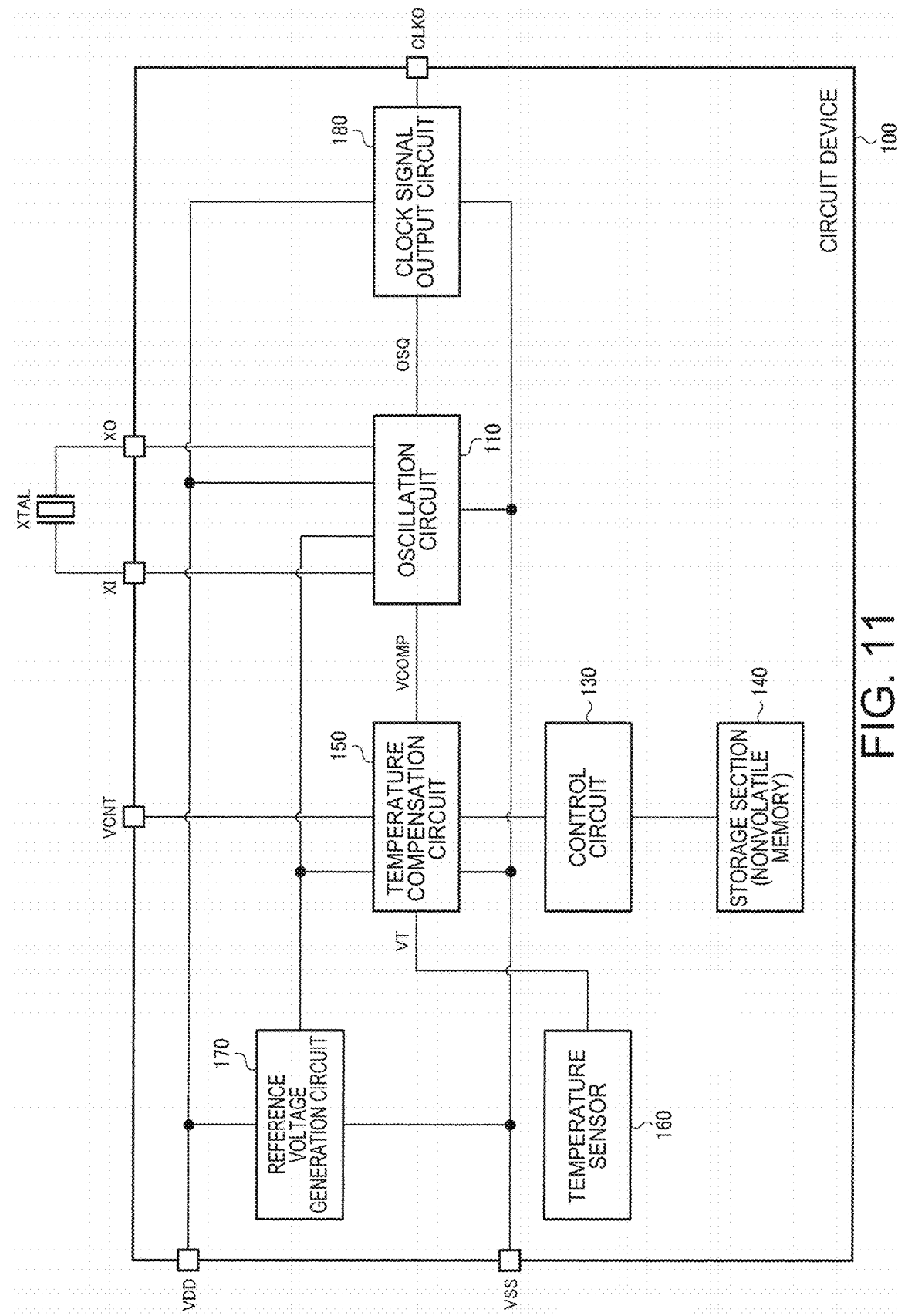
FIG. 11 is a block diagram of an example of a detailed configuration of the circuit device according to the present embodiment.

FIG. 11 is a block diagram of an example of a detailed configuration of the circuit device 100 according to the present embodiment. The circuit device 100 includes a temperature sensor 160, a temperature compensation circuit 150, a control circuit 130, a storage section 140 (nonvolatile memory), an oscillation circuit 110, a clock signal output circuit 180, and the reference voltage generation circuit 170 (bias generation circuit). It is noted that the configuration of the circuit device is not limited to the configuration in FIG. 11, and that part of the components in the configuration can be omitted (a temperature sensor 160, for example), another component can be added to the configuration, and a variety of other variations are conceivable.

The oscillation circuit 110 is a circuit that uses a resonator XTAL to generate the oscillation signal. Specifically, the oscillation circuit 110 is connected to the resonator XTAL via terminals XI and XO. The terminal XI corresponds to the first resonator connection pad disposed in the pad region PAD5 in FIG. 5, and the terminal XO corresponds to the second resonator connection pad disposed in the pad region PAD6 in FIG. 5. The oscillation circuit 110 causes the resonator XTAL to oscillate to generate the oscillation signal. For example, in a TCXO or an OCXO, control voltage VCOMP (voltage for temperature compensation, that is, voltage for compensating temperature characteristic of oscillation frequency) according to the detected temperature is inputted to the oscillation circuit 110, and the oscillation circuit 110 causes the resonator XTAL to oscillate at the oscillation frequency corresponding to the control voltage VCOMP.

The resonator XTAL is a piezoelectric resonator, for example a quartz crystal resonator. The resonator XTAL may instead be an oven-type resonator provided in a constant temperature oven. The resonator XTAL may still instead be a resonator cavity (electromechanical resonator device or electrical resonator circuit). As the resonator XTAL, a piezoelectric resonator, a SAW (surface acoustic wave) resonator device, a MEMS (micro electro mechanical systems) resonator, or any other resonator can be employed. The substrate of the resonator XTAL can be made, for example, of quartz crystal, lithium tantalite, lithium niobate, or any other piezoelectric single crystal, lead zirconate titanate or any other piezoelectric ceramic material, or a silicon semiconductor material. As an exciter that excites the resonator XTAL, an exciter based on the piezoelectric effect or an exciter based on Coulomb force electrostatic driving.

The clock signal output circuit 180 outputs a clock signal to a terminal CLKO on the basis of an output signal OSQ from the oscillation circuit 110. The terminal CLKO corresponds to the clock signal output pad disposed in the pad region PAD3 in FIG. 5. The clock signal output circuit 180 buffers the output signal OSQ or a divided output signal OSQ (amplifies the signal to drive external load) and outputs the buffered signal as the clock signal.

The control circuit 130 controls each portion of the circuit device 100. The control circuit 130 further functions as an interface with a device (CPU, for example) outside the circuit device 100. The control circuit 130 is achieved by a logic circuit, for example, a gate array. The control circuit 130 is disposed, for example, in the disposition region MEM or TCMP in FIG. 5.

The storage section 140 stores a variety of pieces of information necessary for actions of the circuit device 100. For example, the storage section 140 stores, for example, information necessary for the temperature compensation circuit 150 to perform the temperature compensation (coefficients of polynomial for temperature compensation). The information is externally written (from tester, for example), for example, when the circuit device 100 is manufactured or when the circuit device 100 and the resonator XTAL are packaged to manufacture an oscillator. The storage section 140 is, for example, a nonvolatile memory (for example, FAMOS (Floating gate Avalanche injection MOS) type and MONOS (Metal Oxide Nitride Oxide Silicon) type).

The temperature compensation circuit 150 generates the control voltage VCOMP (voltage for temperature compensation) for achieving the temperature compensation of the oscillation frequency produced by the oscillation circuit 110 on the basis of a temperature detection signal VT (temperature detection voltage) from the temperature sensor 160 and outputs the control voltage VCOMP to the oscillation circuit 110. For example, a tester measures the oscillation frequency temperature characteristic of the resonator XTAL and determines a third-order or fifth-order polynomial (approximation) that cancels the temperature characteristic (suppresses variation in oscillation frequency due to temperature characteristic). The coefficients of the polynomial are then written on the storage section 140. When the temperature compensation circuit 150 performs the temperature compensation, the control circuit 130 reads the coefficients of the polynomial from the storage section 140 and outputs the coefficients to the temperature compensation circuit 150, and the temperature compensation circuit 150 generates the control voltage VCOMP, which cancels the oscillation frequency temperature characteristic (suppresses variation in oscillation frequency due to temperature characteristic). The temperature compensation circuit 150 outputs the control voltage VCOMP also on the basis of oscillation frequency control voltage externally inputted via a terminal VCNT. For example, the temperature compensation circuit 150 sums the temperature compensation control voltage generated on the basis of the temperature detection signal VT and the control voltage externally inputted via the terminal VCNT and outputs the summed voltage as the control voltage VCOMP. The terminal VCNT corresponds to the control voltage input pad disposed in the pad region PAD4 in FIG. 5.

The temperature sensor 160 is a sensor that detects the temperature of the circuit device 100 (semiconductor chip). For example, the temperature sensor 160 can be formed, for example, of a diode (PN junction). In this case, the temperature is detected by using the fact that the forward voltage of the diode has temperature dependency. That is, the temperature sensor 160 outputs the temperature detection signal VT on the basis of the forward voltage of the diode. The temperature sensor 160 is not limited to the configuration described above and can be a thermistor or any of a variety of other temperature sensors. The temperature sensor 160 is disposed, for example, in the disposition region BIS in FIG. 5.

The reference voltage generation circuit 170 is a circuit that generates electric power, reference voltage, bias voltage, bias current, and other physical quantities to be supplied to each portion of the circuit device 100. Specifically, the high-potential-side electric power is inputted to the reference voltage generation circuit 170 via the terminal of the high-potential-side power supply VDD, and the low-potential-side electric power (ground) is inputted to the reference voltage generation circuit 170 via the terminal of the low-potential-side power supply VSS. The terminal of the highpotential-side power supply VDD corresponds to the high-potential-side power supply pad disposed in the pad region PAD2 in FIG. 5, and the terminal of the low-potential-side power supply VSS corresponds to the low-potential-side power supply pad disposed in the pad region PAD1 in FIG. 5. For example, the reference voltage generation circuit 170 can include a bandgap reference circuit that generates voltage that hardly depends on temperature (voltage that serves as reference for each voltage to be generated), a regulator that generates electric power, reference voltage, and bias voltage, a current generation circuit that generates bias current, and other components. For example, the reference voltage generation circuit 170 supplies the temperature compensation circuit 150 with the reference voltage or the oscillation circuit 110 with the power supply voltage (VRA in FIG. 12, for example).

In FIG. 11, the description has been made with reference to the case where the circuit device performs analog-based temperature compensation (based on analog signal processing), but not necessarily. That is, the invention is also applicable to a case where the circuit device performs digital-based temperature compensation (based on digital signal processing). Specifically, a digital-based temperature compensation circuit includes an A/D conversion circuit that converts analog temperature detection voltage into digital temperature detection data and a digital signal processing circuit that generates control data (temperature compensation data) on the basis of the temperature detection data. In a case where the oscillation circuit is a VCO, for example, the circuit device includes a D/A conversion circuit that converts digital control data into analog control voltage, and the control voltage is inputted to the VCO for the temperature compensation. The inter-power-supply capacitor described with reference to FIG. 1 and other figures is provided, for example, in the region where the A/D conversion circuit of the temperature compensation circuit is disposed. The inter-power-supply capacitor may instead be provided above the digital signal processing circuit.

7. Oscillation Circuit

Figure 12:
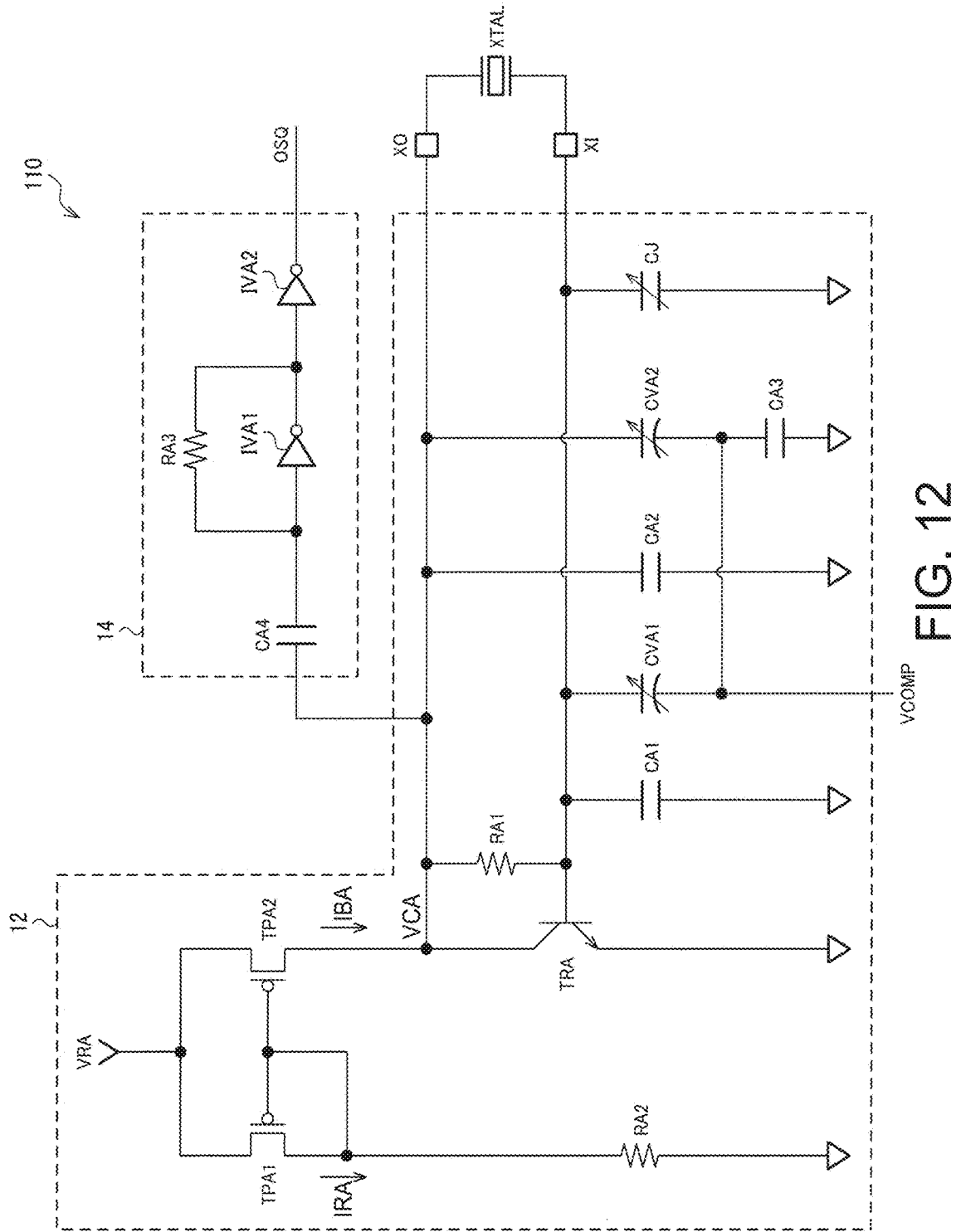
FIG. 12 shows an example of a detailed configuration of an oscillation circuit.

FIG. 12 shows an example of a detailed configuration of the oscillation circuit 110. The oscillation circuit 110 includes an oscillation section 12 (oscillation circuit main body) and a buffer 14 (pre-buffer, amplification section). It is noted that the present embodiment is not limited to the configuration in FIG. 12, and that part of the components in the configuration can be omitted, another component can be added to the configuration, and a variety of other variations are conceivable.

The oscillation section 12 includes a current mirror circuit (current source) formed of transistors TPA1 and TPA2 (p-type transistors, first conductivity type transistor) and a resistive element RA2. The current mirror circuit mirrors current IRA flowing through the resistive element RA2 and outputs bias current IBA.

The oscillation section 12 further includes a bipolar transistor TRA, a resistive element RA1, capacitors CA1 to CA3, variable capacitance capacitors CVA1 and CVA2, and an adjustment capacitor CJ. The collector terminal of the bipolar transistor TRA is connected to one end of the resonator XTAL via the terminal XO (pad), and the base terminal of the bipolar transistor TRA is connected the other end of the resonator XTAL via the terminal XI (pad). Base-emitter current produced by the oscillation of the resonator XTAL flows through the bipolar transistor TRA. When the base-emitter current increases, collector-emitter current increases, and the bias current IBA that branches to the resistive element RA1 decreases, so that collector voltage VCA decreases. On the other hand, when the base-emitter current decreases, the collector-emitter current decreases, and the bias current IBA that branches to the resistive element RA1 increases, so that the collector voltage VCA increases. Since the collector voltage VCA is fed back to the resonator XTAL, the resonator XTAL oscillates.

The oscillation frequency of the resonator XTAL has a temperature characteristic, and the temperature characteristic is compensated by the control voltage VCOMP generated by the temperature compensation circuit 150. That is, the control voltage VCOMP is inputted to one end of each of the variable capacitance capacitors CVA1 and CVA2, and the control voltage VCOMP controls the capacitance values of the variable capacitance capacitors CVA1 and CVA2. The other end of each of the variable capacitance capacitors CVA1 and CVA2 is connected to the base terminal and the collector terminal of the bipolar transistor TRA. When the capacitance values of the variable capacitance capacitors CVA1 and CVA2 change, the resonance frequency of the oscillation loop changes, whereby variation in the oscillation frequency due to the temperature characteristic of the resonator XTAL is compensated.

The adjustment capacitor CJ corresponds to the adjustment capacitor 70 described with reference to FIG. 5. One end of the adjustment capacitor CJ is connected to the node of the terminal XI, and the other end of the adjustment capacitor CJ is connected to the node of the low-potential-side power supply. One end of the adjustment capacitor CJ may instead be connected to the node of the terminal XO. The capacitance value of the adjustment capacitor CJ can be variably set, and the capacitance value is adjusted for adjustment of a reference oscillation frequency. For example, the capacitance value of the adjustment capacitor CJ is so adjusted that the oscillation frequency in a case where the environment temperature is set at a predetermined temperature (25 degrees, for example) and the control voltage VCOMP is set as predetermined voltage coincides with a predetermined oscillation frequency (for example, nominal oscillation frequency defined in the specifications). For example, the adjustment capacitor CJ includes a plurality of capacitors and a switch circuit that switches whether or not each of the capacitors is connected to the node of the terminal XI. The capacitance value of the adjustment capacitor CJ is adjusted, for example, at the time of manufacture, and the set capacitance value is stored in the nonvolatile memory.

The oscillation circuit according to the present embodiment does not necessarily have the configuration in FIG. 12, and any of a variety of other oscillation circuits can be employed. Further, the description in FIG. 12 has been made with reference to the case where CVA1 and CVA2 are variable capacitance capacitors, but not necessarily in the present embodiment, and only one of CVA1 and CVA2 may be a variable capacitance capacitor controlled by the control voltage VCOMP.

The buffer 14 includes a capacitor CA4, a resistive element RA3, and inverters IVA1 and IVA2. Collector voltage VCA (oscillation signal) is inputted to the inverter IVA1 via the capacitor CA4. The output from the inverter IVA1 is fed back via the resistive element RA3 to the input of the inverter IVA1, whereby the bias point of the input to the inverter IVA1 is controlled. The inverter IVA2 buffers the output from the inverter IVA1 and outputs the buffered signal as the output signal OSQ.

7. Clock Signal Output Circuit

Figure 13:
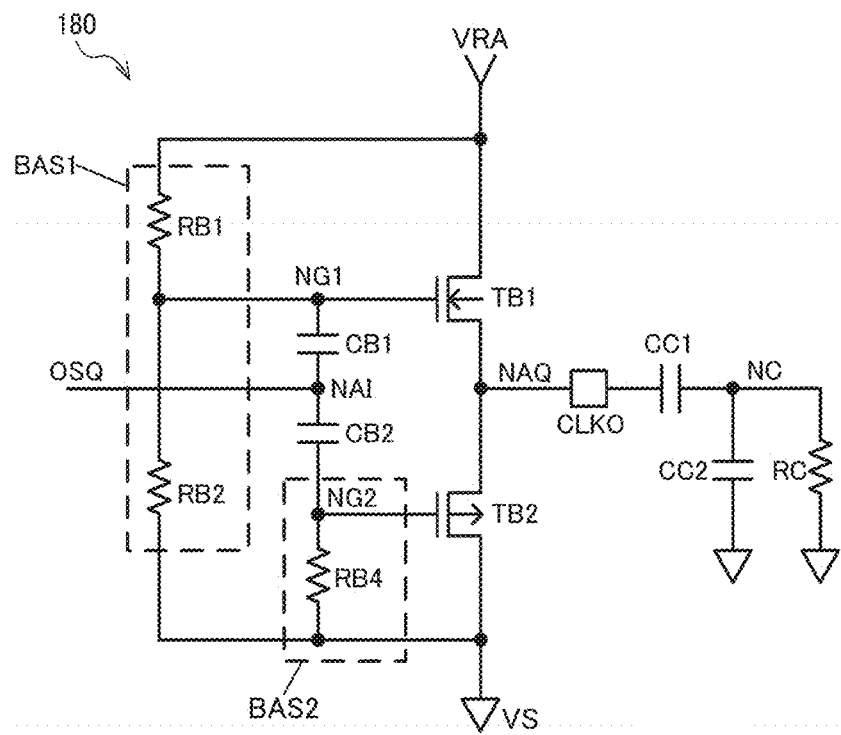
FIG. 13 shows an example of a detailed configuration of a clock signal output circuit.

FIG. 13 shows an example of a detailed configuration of the clock signal output circuit 180. It is noted that the present embodiment is not limited to the configuration in FIG. 13, and that part of the components in the configuration can be omitted, another component can be added to the configuration, and a variety of other variations are conceivable. For example, the following description will be made with reference to a case where the clock signal output circuit 180 outputs a clipped sine-wave clock signal, but not necessarily. For example, the clock signal output circuit 180 may be a circuit that outputs a rectangular-wave (CMOS level, for example) clock signal.

The clock signal output circuit 180 in FIG. 13 includes transistors TB1 and TB2, bias voltage setting circuits BAST and BAS2, and capacitors CB1 and CB2.

The transistor TB1 is provided between the node of a power supply VRA (high-potential-side power supply node) and an output node NAQ. The transistor TB2 is provided between the output node NAQ and the node of a power supply VS (low-potential-side power supply node). For example, the transistor TB1 is an n-type transistor (first conductivity type transistor), and the transistor TB2 is a p-type transistor.

The bias voltage setting circuit BAS1 is a circuit that sets bias voltage and applies the bias voltage to a gate node NG1 of the transistor TB1. The bias voltage setting circuit BAS1 includes, for example, resistive elements RB1 and RB2 provided in series between the node of the power supply VRA and the node of the power supply VS. The voltage obtained by resistance division of the voltage between VRA and VS by using the resistive elements RB1 and RB2 is therefore applied as the bias voltage to the gate node NG1.

The bias voltage setting circuit BAS2 is a circuit that sets bias voltage and applies the bias voltage to a gate node NG2 of the transistor TB2. The bias voltage setting circuit BAS2 includes, for example, a resistive element RB4 provided between the gate node NG2 and the node of the power supply VS.

The capacitor CB1 is provided between an input node NAI, to which the output signal OSQ from the buffer 14 of the oscillation circuit 110 is inputted, and the gate node NG1. The capacitor CB2 is provided between the input node NAI and the gate node NG2. The capacitors CB1 and CB2 are each a capacitor for DC removal (for AC coupling).

A capacitor CC1 is provided between the terminal CLKO and an external node NC. A resistive element RC and a capacitor CC2, which are connected to the node NC, represent external loads.

When voltage at the node NAI changes, the voltage at the node NG1 changes with respect to the bias voltage set by the bias voltage setting circuit BAS1. The voltage at the node NG2 changes with respect to the bias voltage set by the bias voltage setting circuit BAS2. That is, change in the gate voltage at each of the transistors TB1 and TB2 with respect to the corresponding bias voltage controls the drive capability (on-resistance) of each of the transistors TB1 and TB2. A clipped sine-wave signal is thus outputted to the output node NAQ. The clipped sine-wave signal is a signal having a sine wave shape with upper and lower portions thereof clipped at a predetermined voltage level (power supply voltage level, for example).

8. Temperature Compensation Circuit

Figure 14:
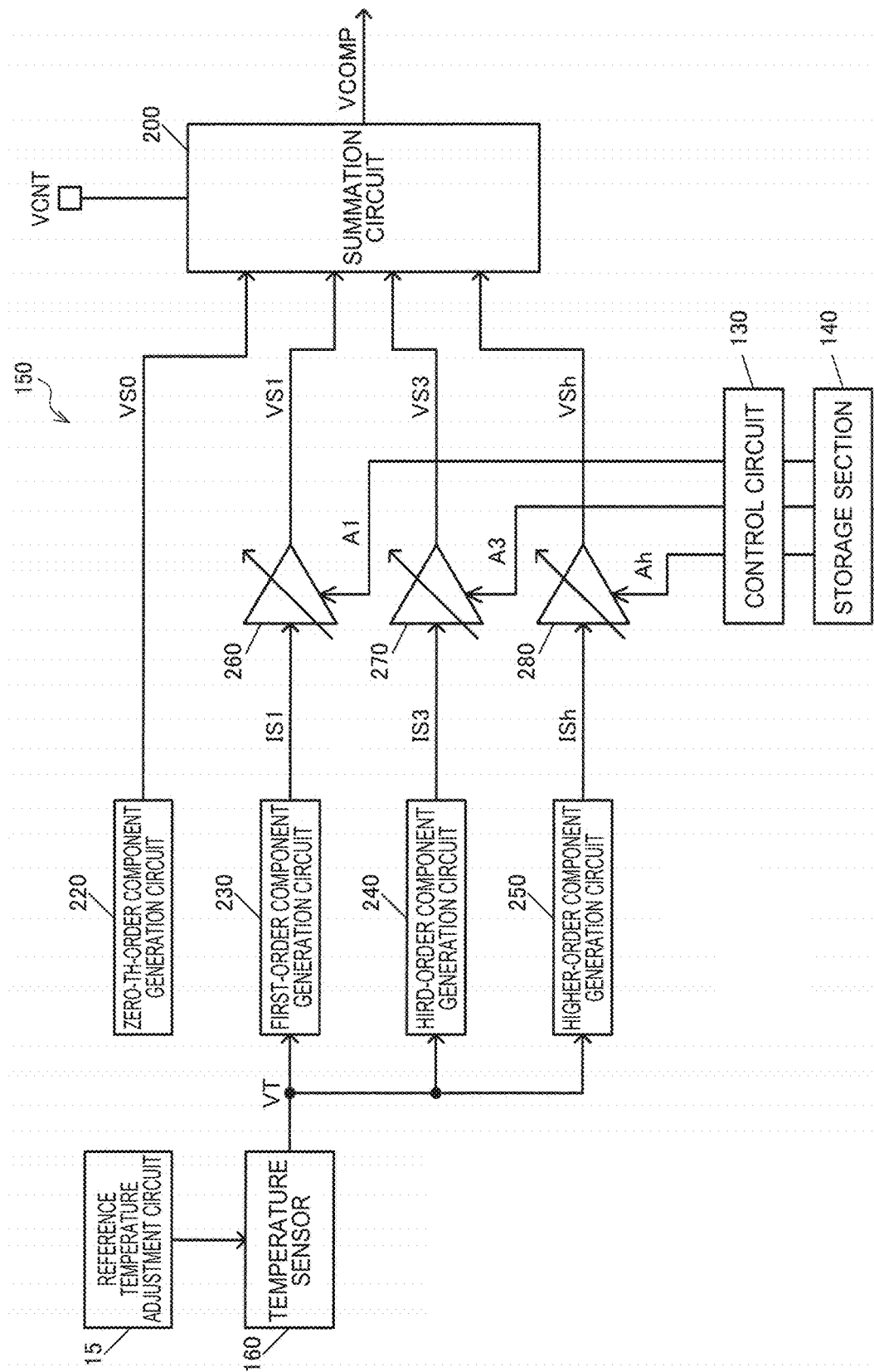
FIG. 14 shows an example of a detailed configuration of a temperature compensation circuit.

FIG. 14 shows an example of a detailed configuration of the temperature compensation circuit 150. The temperature compensation circuit 150 includes a reference temperature adjustment circuit 15, a zero-th-order component generation circuit 220, a first-order component generation circuit 230, a third-order component generation circuit 240, a higher-order component generation circuit 250, a first-order component gain adjustment circuit 260, a third-order component gain adjustment circuit 270, a higher-order component gain adjustment circuit 280, and a summation circuit 200. It is noted that the present embodiment is not limited to the configuration in FIG. 14, and that part of the components in the configuration can be omitted, another component can be added to the configuration, and a variety of other variations are conceivable.

The reference temperature adjustment circuit 15 is a circuit that adjusts a reference temperature T0 for the control voltage VCOMP (voltage for temperature compensation) and adjusts the reference temperature T0, for example, by adjusting the reference voltage of the temperature detection signal VT (temperature detection voltage). The first-order component, the third-order component, and the higher-order components of the control voltage VCOMP are each symmetric with respect to the reference temperature T0, and the reference temperature adjustment circuit 15 adjusts the centers of the symmetry.

The zero-th-order component generation circuit 220 outputs zero-th-order component voltage VS0 (zero-th-order component signal), which approximates the zero-th-order component of the temperature characteristic of the oscillation frequency produced by the resonator XTAL (quartz crystal resonator). The zero-th-order component generation circuit 220 is formed of a circuit that outputs DC voltage, for example, a resistance division circuit.

The first-order component generation circuit 230 outputs first-order component current IS1 (first-order component signal in a broad sense), which approximates the first-order component of the temperature characteristic of the oscillation frequency produced by the quartz crystal resonator. That is, let T be the temperature, and IS1 is current that approximates a function proportional or inversely proportional to $(T-T0)$. The first-order component generation circuit 230 can be formed, for example, of a non-inversion amplification amplifier. The first-order component gain adjustment circuit 260 adjusts the gain applied to the first-order component current IS1 on the basis of a gain value A1 stored in the storage section 140 and outputs first-order component voltage $VS1=A1 \times IS1$ (first-order output signal in a broad sense). The first-order component generation circuit 230 and the first-order component gain adjustment circuit 260 may be configured as a gain adjustable integrated amplifier circuit (non-inversion amplification amplifier, for example).

The third-order component generation circuit 240 outputs third-order component current IS3 (third-order component signal in a broad sense), which approximates the third-order component of the temperature characteristic of the oscillation frequency produced by the quartz crystal resonator. That is, IS3 is current that approximates a function proportional or inversely proportional to $(T-T0)^3$. The third-order component gain adjustment circuit 270 adjusts the gain applied to the third-order component current IS3 on the basis of a gain value A3 stored in the storage section 140 and outputs third-order component voltage $VS3=A3 \times IS3$ (third-order output signal in a broad sense).

The higher-order component generation circuit 250 outputs higher-order component current ISh (higher-order component signal in a broad sense), which approximates higher-order components of fourth or higher order components of the temperature characteristic of the oscillation frequency produced by the quartz crystal resonator. That is, ISh is current that approximates a higher-order function $g(T-T0)$. For example, $g(T-T0)$ is a composite function that is the combination of a function proportional or inversely proportional to $(T-T0)^4$ and a function proportional or inversely proportional to $(T-T0)^3$. The higher-order component gain adjustment circuit 280 adjusts the gain applied to the higher-order component current ISh on the basis of a gain value Ah stored in the storage section 140 and outputs higher-order component voltage VSh=Ah×ISh (higher-order output signal in a broad sense).

The summation circuit 200 sums the zero-th-order component voltage VS0, the first-order component voltage VS1, the third-order component voltage VS3, the higher-order component voltage VSh, and the control voltage externally inputted via the terminal VCNT and outputs the control voltage VCOMP. Assuming that VS0=A0, the control voltage VCOMP is voltage that approximates VCOMP=Ah×g$(T-T0)+A3(T-T0)^3+A1(T-T0)+A0$.

The exemplary configuration in FIG. 14 has been described with reference to the case where the current IS1 is outputted as the first-order component signal, the current IS3 is outputted as the third-order component signal, and the current ISh is outputted as the higher-order component signal, but not necessarily in the present embodiment. That is, voltage may be outputted as each of the first-order component signal, the third-order component signal, and the higher-order component signal.

9. Oscillator, Electronic Apparatus, and Vehicle

Figure 15:
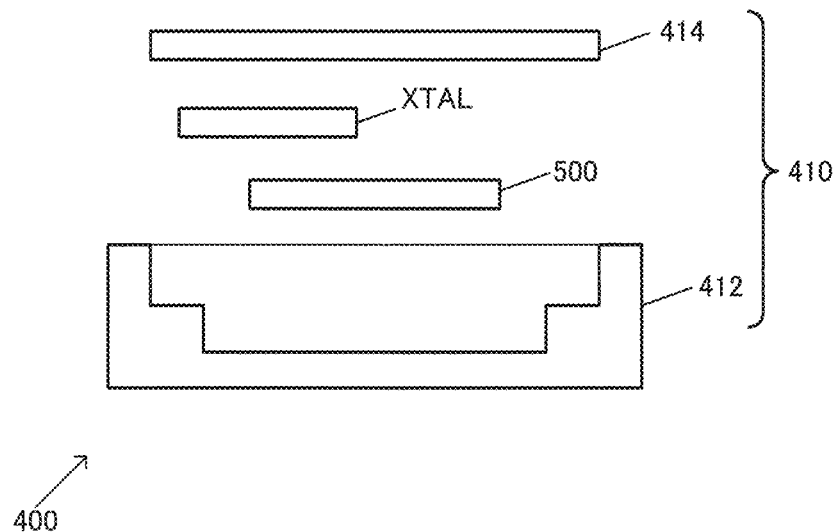
FIG. 15 shows an example of the configuration of an oscillator.

FIG. 15 shows an example of the configuration of an oscillator 400 including a circuit device 500 according to the present embodiment. The oscillator 400 includes the circuit device 500 and the resonator XTAL (resonator, resonator element) electrically continuous with the oscillation circuit of the circuit device 500. The circuit device 500 corresponds to the circuit device 100 or the circuit device 120 described above. The oscillator 400 can instead contain a package 410, which accommodates the circuit device 100 and the resonator XTAL. It is noted that the oscillator does not necessarily have the configuration in FIG. 15, and that part of the components in the configuration can be omitted, another component can be added to the configuration, and a variety of other variations are conceivable.

The package 410 is formed, for example, of a base section 412 and a lid section 414. The base section 412 is a member having, for example, a box-like shape and made of an insulating material, such as a ceramic material, and the lid section 414 is a member having, for example, a flat-plate shape and bonded to the base section 412. The base section 412, for example, the bottom surface thereof is provided with an external connection terminal (external electrode) that allows connection to an external apparatus. The circuit device 500 and the resonator XTAL are accommodated in an internal space (cavity) formed by the base section 412 and the lid section 414. When the lid section 414 seals the internal space, the circuit device 500 and the resonator XTAL are hermetically encapsulated in the package 410.

The circuit device 500 and the resonator XTAL are implemented in the package 410. The terminals of the resonator XTAL and the terminals (pads) of the circuit device 500 (IC) are electrically connected to each other via internal wiring in the package 410.

Figure 16:
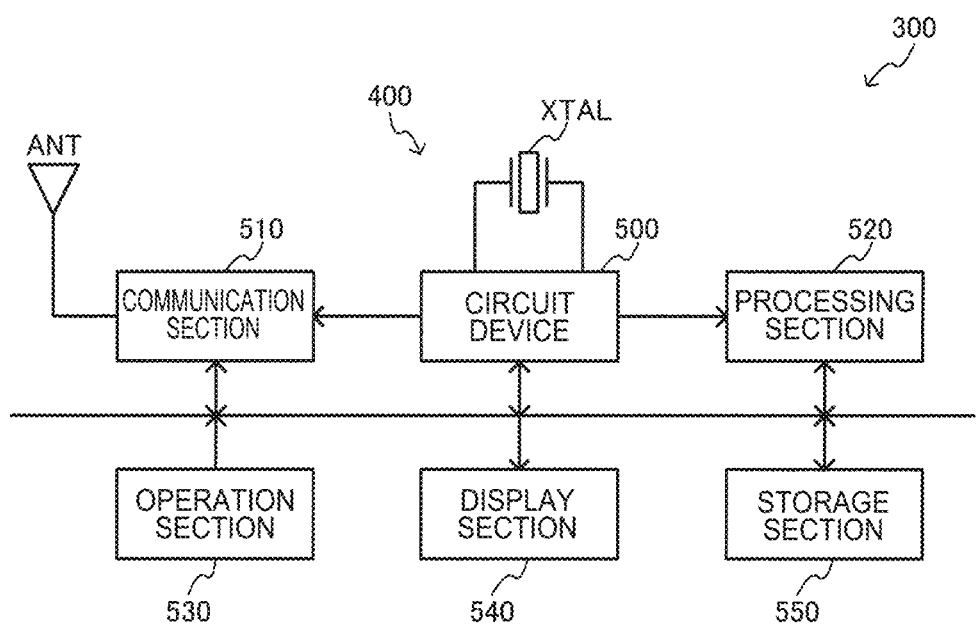
FIG. 16 shows an example of the configuration of an electronic apparatus.

FIG. 16 shows an example of the configuration of an electronic apparatus 300 including the circuit device 500 according to the present embodiment. The electronic apparatus 300 includes the circuit device 500, the resonator XTAL, such as a quartz crystal resonator, an antenna ANT, a communication section 510 (communication device), and a processing section 520 (processor). The electronic apparatus 300 can further include an operation section 530 (operation device), a display section 540 (display device), and a storage section 550 (memory). The resonator XTAL and the circuit device 500 form the oscillator 400. It is noted that the electronic apparatus 300 does not necessarily have the configuration in FIG. 11, and that part of the components in the configuration can be omitted, another component can be added to the configuration, and a variety of other variations are conceivable.

As the electronic apparatus 300 in FIG. 16, a variety of apparatus are conceivable, for example, as follows: a timepiece with a built-in GPS; a biological information measuring apparatus (such as pulse wave meter and pedometer) or a wearable apparatus, such as a head mounted display; a smartphone, a mobile phone, a portable game console, a notebook PC or a tablet PC, or any other portable information terminal (mobile terminal); a content providing terminal that distributes a content; a digital camera, a video camcorder, or any other video apparatus; or a base station, a router, or any other network-related apparatus.

The communication section 510 (wireless communication circuit) receives data from an external apparatus and transmits data to the external apparatus via the antenna ANT. The processing section 520 controls the electronic apparatus 300 and performs a variety of types of digital processing on the data transmitted and received via the communication section 510. The function of the processing section 520 can be achieved, for example, by a microcomputer or any other processor. The operation section 530 allows a user to perform input operation and can be achieved by operation buttons, a touch panel display, or any other component. The display section 540 displays a variety of pieces of information and can be achieved by a liquid crystal display, an organic EL display, or any other display. In a case where a touch panel display is used as the operation section 530, the touch panel display also functions as the operation section 530 and the display section 540. The storage section 550 stores data, and the function thereof can be achieved by a RAM, a ROM, or any other semiconductor memory, an HDD (hard disk drive), or any other component.

Figure 17:
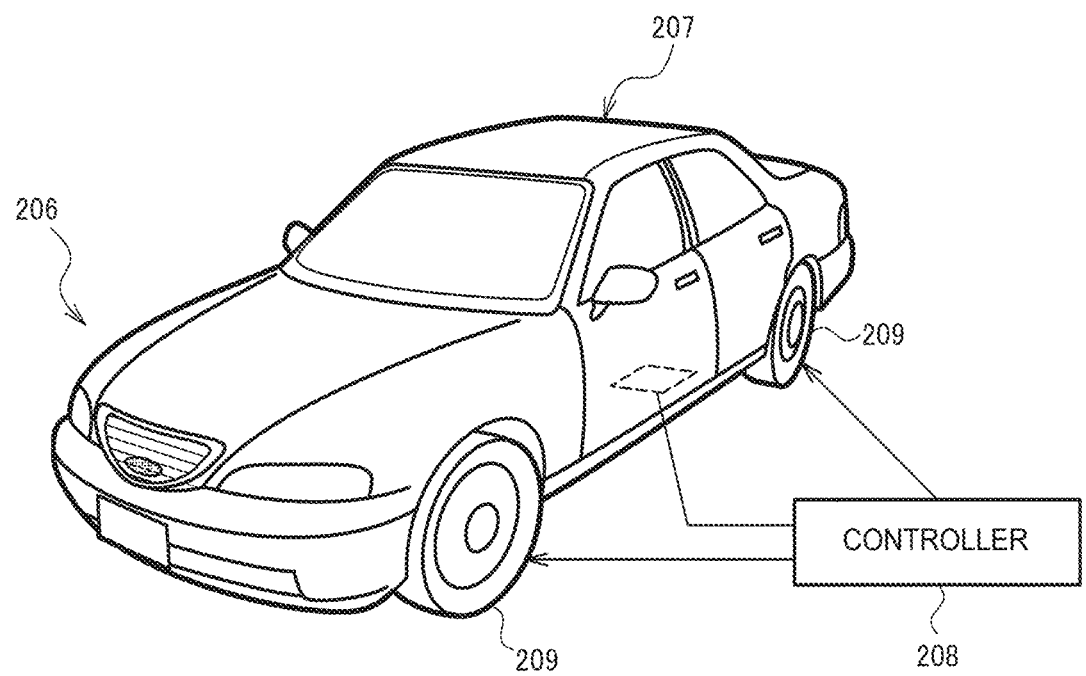
FIG. 17 shows an example of a vehicle.

FIG. 17 shows an example of a vehicle including the circuit device according to the present embodiment. The circuit device (oscillator) according to the present embodiment can be implemented in a variety of vehicles, for example, a car, an airplane, a motorcycle, a bicycle, and a ship. The vehicles are, for example, apparatus and devices that include an engine, a motor, or any other drive mechanism, a steering wheel, a rudder, or any other steering mechanism, and a variety of electronic apparatus (in-vehicle apparatus) and travel on the ground, in the sky, or on the sea. FIG. 17 schematically shows an automobile 206 as a specific example of the vehicles. The automobile 206 incorporates an oscillator (not shown) including the circuit device and the resonator according to the present embodiment. A controller 208 operates in accordance with a clock signal generated by the oscillator. The controller 208, for example, controls the degree of hardness of the suspension in accordance with the posture of a vehicle body 207 and performs braking control on individual wheels 209. For example, the controller 208 may achieve automatic driving of the automobile 206. An apparatus that incorporates the circuit device and the oscillator according to the present embodiment is not necessarily incorporated in the controller 208 and can be incorporated in a variety of apparatus (in-vehicle apparatus) provided in the automobile 206 and other vehicles.

The present embodiment has been described above in detail, and a person skilled in the art will readily appreciate that a large number of variations are conceivable to the extent that they do not substantially depart from the novel items and advantageous effects of the invention. Such variations are all therefore intended to fall within the scope of the invention. For example, a term described at least once in the specification or the drawings along with a different term having a broader meaning or the same meaning can be replaced with the different term anywhere in the specification or the drawings. Further, any combination of the present embodiment and the variations fall within the scope of the invention. Moreover, the configuration, operation, and other factors of each of the circuit device, the oscillator, the electronic apparatus, and the vehicle are not limited to those described in the present embodiment, and a variety of changes can be made thereto.

The entire disclosure of Japanese Patent Application No. 2016-224882, filed Nov. 18, 2016 is expressly incorporated by reference herein.

What is claimed is:

1. A circuit device comprising:
   an oscillation circuit configured to cause a resonator to oscillate;
   a clock signal output circuit configured to output a clock signal based on an oscillation signal from the oscillation circuit;
   a temperature compensation circuit configured to perform temperature compensation on an oscillation frequency of the oscillation signal;
   a low-potential-side power supply pad to which low-potential-side electric power is supplied;
   a high-potential-side power supply pad to which high-potential-side electric power is supplied; and
   an inter-power-supply capacitor provided between a low-potential-side power supply line electrically continuous with the low-potential-side power supply pad and a high-potential-side power supply line electrically continuous with the high-potential-side power supply pad,
   wherein the inter-power-supply capacitor is formed of at least two metal layers provided in a region where the temperature compensation circuit is disposed in a plan view;
   wherein the inter-power-supply capacitor is formed of an i-th metal layer and at least one metal layer located in a layer different from the i-th metal layer; and
   wherein the inter-power-supply capacitor includes:
   a first capacitor formed of the i-th metal layer and an (i−1)-th metal layer, and
   a second capacitor formed of the i-th metal layer and an (i+1)-th metal layer,
   one of the high-potential-side electric power and the low-potential-side electric power is supplied to the i-th metal layer, and
   another of the high-potential-side electric power and the low-potential-side electric power is supplied to the (i−1)-th and (i+1)-th metal layers.

2. The circuit device according to claim 1,
   further comprising an adjustment capacitor for adjusting the oscillation frequency,
   wherein the adjustment capacitor is formed of at least two metal layers provided in a region where the oscillation circuit is disposed in the plan view.

3. An oscillator comprising:
   the circuit device according to claim 2; and
   the resonator electrically continuous with the oscillation circuit.

4. An electronic apparatus comprising the circuit device according to claim 2.

5. A vehicle comprising the circuit device according to claim 2.

6. The circuit device according to claim 1, further comprising:
   a first resonator connection pad connected to one end of the resonator;
   a second resonator connection pad connected to another end of the resonator;
   a control voltage input pad to which control voltage that controls the oscillation frequency generated by the oscillation circuit is inputted;
   a clock signal output pad via which the clock signal is outputted; and
   a second inter-power-supply capacitor,
   wherein the low-potential-side power supply pad, the first resonator connection pad, and the control voltage input pad are disposed in a first pad disposition region along a first edge of the circuit device,
   the clock signal output pad, the second resonator connection pad, and the high-potential-side power supply pad are disposed in a second pad disposition region along a second edge of the circuit device that faces away from the first edge, and
   the second inter-power-supply capacitor is disposed in at least one of the first pad disposition region and the second pad disposition region.

7. The circuit device according to claim 1, further comprising:
   a first electrostatic protection circuit connected to the low-potential-side power supply pad; and
   a second electrostatic protection circuit connected to the high-potential-side power supply pad,
   wherein the low-potential-side power supply pad is disposed in a first pad disposition region along a first edge of the circuit device,
   the high-potential-side power supply pad is disposed in a second pad disposition region along a second edge of the circuit device that faces away from the first edge, and
   the first electrostatic protection circuit and the second electrostatic protection circuit are disposed in a circuit disposition region between the first pad disposition region and the second pad disposition region.

8. The circuit device according to claim 1,
   further comprising a reference voltage generation circuit that includes a resistor circuit for adjusting reference voltage and supplies the temperature compensation circuit with the reference voltage,
   wherein a resistive element that forms the resistor circuit is made of polysilicon, and
   the polysilicon is formed on a well to which low-potential-side power supply voltage is applied.

9. An oscillator comprising:
   the circuit device according to claim 1; and
   the resonator electrically continuous with the oscillation circuit.

10. An electronic apparatus comprising the circuit device according to claim 1.

11. A vehicle comprising the circuit device according to claim 1.

12. A circuit device comprising:
    an oscillation circuit configured to cause a resonator to oscillate;
    a clock signal output circuit configured to output a clock signal based on an oscillation signal from the oscillation circuit;
    a temperature compensation circuit configured to perform temperature compensation on an oscillation frequency of the oscillation signal;

a low-potential-side power supply pad to which low-potential-side electric power is supplied;

a high-potential-side power supply pad to which high-potential-side electric power is supplied;

an inter-power-supply capacitor provided between a low-potential-side power supply line electrically continuous with the low-potential-side power supply pad and a high-potential-side power supply line electrically continuous with the high-potential-side power supply pad, a first resonator connection pad connected to one end of the resonator;

a second resonator connection pad connected to another end of the resonator;

a control voltage input pad to which control voltage that controls the oscillation frequency generated by the oscillation circuit is inputted;

a clock signal output pad via which the clock signal is outputted; and a second inter-power-supply capacitor, wherein the low-potential-side power supply pad, the first resonator connection pad, and the control voltage input pad are disposed in a first pad disposition region along a first edge of the circuit device, the clock signal output pad, the second resonator connection pad, and the high-potential-side power supply pad are disposed in a second pad disposition region along a second edge of the circuit device that faces away from the first edge, the second inter-power-supply capacitor is disposed in at least one of the first pad disposition region and the second pad disposition region, the inter-power-supply capacitor is formed of at least two metal layers provided in a region where the temperature compensation circuit is disposed in a plan view, and the oscillation circuit, the clock signal output circuit, and the temperature compensation circuit are disposed in a circuit disposition region between the first pad disposition region and the second pad disposition region in the plan view.

* * * * *